US012648246B2

(12) United States Patent
Jang et al.

(10) Patent No.: US 12,648,246 B2
(45) Date of Patent: Jun. 2, 2026

(54) IMAGE SENSING DEVICE

(71) Applicant: SK hynix Inc., Icheon-si (KR)

(72) Inventors: Jae Hyung Jang, Icheon-si (KR); Jong Chae Kim, Icheon-si (KR); Hyung June Yoon, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 930 days.

(21) Appl. No.: 17/524,368

(22) Filed: Nov. 11, 2021

(65) Prior Publication Data

US 2022/0190008 A1      Jun. 16, 2022

(30) Foreign Application Priority Data

Dec. 16, 2020     (KR) ......................... 10-2020-0176198

(51) Int. Cl.
*H10F 39/00*            (2025.01)
(52) U.S. Cl.
CPC ................................. *H10F 39/807* (2025.01)
(58) Field of Classification Search
CPC ...................................................... H10F 39/807
See application file for complete search history.

(56) References Cited

U.S. PATENT DOCUMENTS

| | | | |
|---|---|---|---|
| 2001/0004117 A1* | 6/2001 | Chikamatsu | H10F 30/221 |
| | | | 257/229 |
| 2007/0075338 A1 | 4/2007 | Park et al. | |
| 2013/0248862 A1 | 9/2013 | Inoue et al. | |

| | | | |
|---|---|---|---|
| 2014/0198183 A1 | 7/2014 | Kim et al. | |
| 2015/0155328 A1 | 6/2015 | Park et al. | |
| 2016/0249002 A1 | 8/2016 | Kim et al. | |
| 2017/0133415 A1* | 5/2017 | Tsai | H01L 23/58 |
| 2018/0076259 A1* | 3/2018 | Park | H10F 77/14 |
| 2019/0379844 A1 | 12/2019 | Chen et al. | |
| 2021/0364604 A1* | 11/2021 | Isogai | G01S 7/4816 |

(Continued)

FOREIGN PATENT DOCUMENTS

| | | |
|---|---|---|
| CN | 102194846 A | 9/2011 |
| CN | 103985721 A | 8/2014 |

(Continued)

OTHER PUBLICATIONS

Notification to Grant Patent Rights for Invention for CN Appl. No. 202111270718.9, mailed on May 29, 2024, 6 pages with English translation.

(Continued)

*Primary Examiner* — Ali Naraghi
(74) *Attorney, Agent, or Firm* — Perkins Coie LLP

(57) ABSTRACT

An image sensing device includes a plurality of unit pixels, wherein each of the unit pixels includes a photoelectric conversion region disposed in a substrate, and configured to generate photocharges in response to incident light, a control region disposed in the substrate and configured to receive a control signal and generate a current in the substrate based on the control signal to carry and move the photocharges generated in the photoelectric conversion region, a detection region disposed in the substrate and configured to receive the current and to capture the photocharges carried by the current and a guard ring region configured to surround the control region, and wherein the hole current flows between the control region and the guard ring region.

16 Claims, 16 Drawing Sheets

300a

(56)            References Cited

U.S. PATENT DOCUMENTS

| 2022/0190008 | A1* | 6/2022 | Jang | H10F 39/807 |
| 2024/0006445 | A1* | 1/2024 | Suzuki | H10F 39/199 |

FOREIGN PATENT DOCUMENTS

| EP | 3244529 | A1 | 11/2017 |
| KR | 20070038338 | A | 4/2007 |
| KR | 10-2016-0109991 | A | 9/2016 |
| KR | 20180103124 | A | 9/2018 |
| KR | 20190127677 | A | 11/2019 |
| KR | 20200010045 | A | 1/2020 |
| WO | 2020017343 | A1 | 1/2020 |
| WO | 2020158322 | A | 12/2021 |

OTHER PUBLICATIONS

Request for the Submission of an Opinion for KR Appl. No. 10-2020-0176198, mailed on Jan. 23, 2025, 12 pages with English translation.

Request for the Submission of an Opinion for KR Appl. No. 10-2020-0176198, mailed on Aug. 1, 2025, 16 pages with English translation.

* cited by examiner

<u>1400a</u>

1440a
1450a
1430a
1420a

1410a

IMAGE SENSING DEVICE

CROSS-REFERENCE TO RELATED APPLICATION

This patent document claims the priority and benefits of Korean patent application No. 10-2020-0176198, filed on Dec. 16, 2020, the disclosure of which is incorporated by reference in its entirety as part of the disclosure of this patent document.

TECHNICAL FIELD

The technology and implementations disclosed in this patent document generally relate to an image sensing device, and more particularly to an image sensor capable of sensing a distance to a target object.

BACKGROUND

An image sensing device is a device for capturing at least one image using semiconductor characteristics that react to light incident thereon to produce an image. In recent times, with the increasing development of computer industries and communication industries, the demand for high-quality and high-performance image sensors has been rapidly increasing in various electronic devices, for example, smartphones, digital cameras, game consoles, Internet of Things (IoT), robots, surveillance cameras, medical micro-cameras, etc.

Image sensing devices may be broadly classified into CCD (Charge Coupled Device)-based image sensing devices and CMOS(Complementary Metal Oxide Semiconductor)-based image sensing devices. The CCD image sensing device may be superior to the CMOS image sensing device in terms of noise and image quality. However, the CMOS image sensing device may be driven more easily than the CCD image sensing device, and may be implemented using many more scanning schemes than those of the CCD image sensing device.

In addition, the CMOS image sensing device may integrate a signal processing circuit into a single chip using a semiconductor fabrication process, such that the CMOS image sensing device can be easily fabricated as a small-sized product, and has very lower power consumption, resulting in reduction in production costs. In recent times, the CMOS image sensing device has been designed to be more compatible with mobile devices, such that CMOS image sensing devices have been intensively researched and rapidly come into widespread use.

SUMMARY

Various embodiments of the disclosed technology relate to an image sensing device having a structure optimized for discriminating detection signals between adjacent unit pixels.

In accordance with an embodiment of the disclosed technology, an image sensing device may include a plurality of unit pixels, wherein each of the unit pixels includes a photoelectric conversion region disposed in a substrate, and configured to generate photocharges in response to incident light, a control region disposed in the substrate and configured to receive a control signal and generate a current in the substrate based on the control signal to carry and move the photocharges generated in the photoelectric conversion region, a detection region disposed in the substrate and configured to receive the current and to capture the photocharges carried by the current and a guard ring region configured to surround the control region, and wherein the hole current flows between the control region and the guard ring region.

In some implementations, the plurality of unit pixels is arranged in multiple rows and columns of a pixel array, and the guard ring region is configured to control a movement of the photocharges generated between two adjacent unit pixels. In some implementations, the control region is configured to receive the control signal having a first voltage or a second voltage. In some implementations, the control signal has a phase difference of a certain degree with respect to the incident light. In some implementations, the plurality of unit pixels includes four unit pixels constructing a (2×2) matrix array and control regions of the four unit pixels are configured to receive control signals having different phases from one another. In some implementations, the control signals having different phases include a first control signal having a phase difference of 90° with respect to a second control signal; the second control signal having a phase difference of 90° with respect to a third control signal; the third control signal having a phase difference of 90° with respect to a fourth control signal; and the fourth control signal having a phase difference of 90° with respect to the first control signal In some implementations, the detection region is disposed to surround the control region and the guard ring region is disposed to surround the control region. In some implementations, the guard ring region is configured to receive a voltage. In some implementations, each of the unit pixels may further include a drain region disposed in the substrate and configured to remove photocharges in the substrate. In some implementations, the drain region is connected to a drain transistor configured to receive a drain transistor control signal to turn on the drain transistor. In some implementations, the drain transistor control signal has a phase difference of 180° with respect to the control signal applied to the control region. In some implementations, the drain region is disposed between the control region and the guard ring region. In some implementations, the drain region is disposed between the detection region and the guard ring region.

In some implementations, each of the unit pixels may include at least two drain regions, each drain region supported by the substrate and configured to remove photocharges in the substrate, and the at least two drain regions are configured to share one drain transistor. In some implementations, the guard ring region may include a first region doped with P-type conductive impurities and a second region doped with P-type conductive impurities. In some implementations, the first region has a higher doping density than that of the second region, and a doping depth of the first region in the substrate is smaller than a doping depth of the second region in the substrate.

In accordance with an embodiment of the disclosed technology, an image sensing device may include a plurality of unit pixels, wherein each of the unit pixels configured to receive an incident light and generate photocharges corresponding to the incident light and includes, at least one tap region configured to receive a control signal and generate a current based on the control signal, the at least one tap region further configured to capture the photocharges moving by the current and a guard ring region disposed to surround the tap region and configured to control a movement of the photocharges between tap regions included in two adjacent unit pixels.

In some implementations, the plurality of unit pixels includes four unit pixels constructing a (2×2) matrix array and the at least one tap region of the four unit pixels are configured to receive control signals having different phases from one another. In some implementations, the control signals having different phases include a first control signal having a phase difference of 90° with respect to a second control signal, the second control signal having a phase difference of 90° with respect to a third control signal, the third control signal having a phase difference of 90° with respect to a fourth control signal and the fourth control signal having a phase difference of 90° with respect to the first control signal.

In some implementations, the four unit pixels include control regions that are configured to receive the first to fourth control signals, respectively. In some implementations, the plurality of unit pixels includes four unit pixels constructing a (2×2) matrix array and output pixel signals that are used to calculate to obtain depth data about a target object. In some implementations, pixel signals respectively detected from the four unit pixels included in the (2×2) matrix array are calculated to obtain depth data about a target object.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
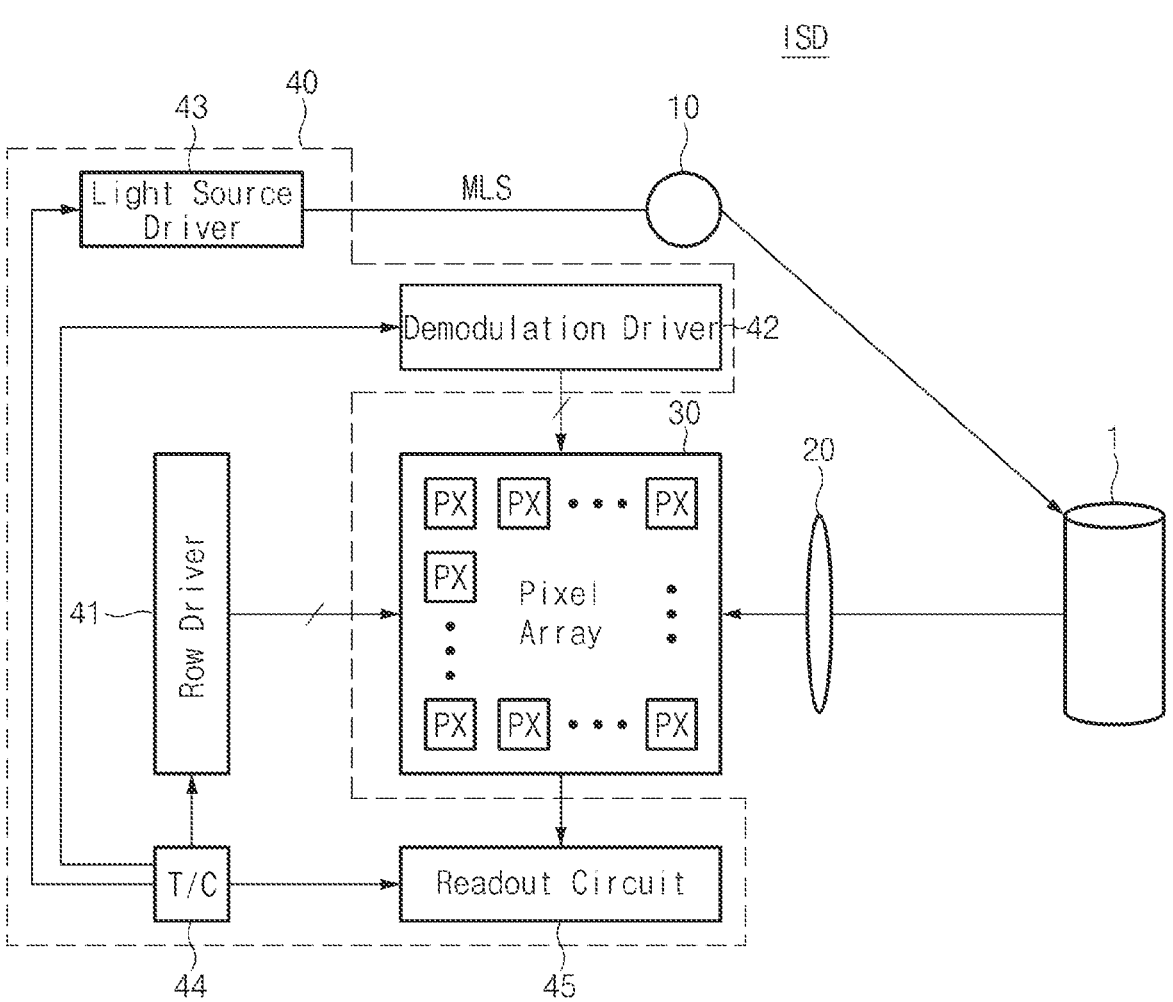
FIG. 1 is a block diagram illustrating an example of an image sensing device based on some implementations of the disclosed technology.

This patent document provides implementations and examples of an image sensing device and the disclosed technology may be implemented to achieve one or more advantages in imaging applications. Some implementations of the disclosed technology relate to an image sensing device having a structure optimized for discriminating detection signals between adjacent unit pixels. The disclosed technology provides the image sensing device which can allow a control region included in a unit pixel to be surrounded by a guard ring region, such that electron detection efficiency can be improved and signal interference between adjacent unit pixels can be reduced. In the image sensing device based on other implementations of the disclosed technology, each unit pixel includes a drain region, such that noise electrons generated by each unit pixel can be removed.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings.

The three-dimensional (3D) sensing is a growing research field that includes methods for acquiring the depth information by using an image sensor in various applications. There have been much developments and studies for measuring range and depth (i.e., a distance to a target object) using image sensing devices. For example, demand for the above-mentioned depth measurement schemes using image sensors is rapidly increasing in various devices, for example, security devices, medical devices, automobiles, game consoles, virtual reality (VR)/augmented reality (AR) devices, mobile devices, etc. Examples of 3D sensing that can measure depth information using one or more image sensors include a triangulation method, a time of flight (TOF) method, and an interferometry method. The time of flight (TOF) method, among the above-mentioned depth measurement methods, is used in many applications because it has a wide range of applications, a high processing speed, and cost efficiency.

According to the TOF method, the distance (i.e., depth) to a target object is calculated using emitted light and reflected light. Depending on whether a round-trip time or a phase difference of light is used to determine the distance between the TOF sensor and an object, the TOF method may be mainly classified into a direct method and an indirect method.

The direct method may calculate a round trip time and measure the distance to a target object using the calculated round trip time. The indirect method may measure the distance to the target object using a phase difference. The direct method is generally used for automobiles because it has advantages in terms of long-distance measurement. The indirect method is used for a game machine or a mobile camera that is used at a shorter distance and requires a faster processing speed. The indirect method can be implemented using a simple circuit at a low cost.

In some implementations, the indirect TOF sensor may be implemented using a current-assisted photonic demodulator (CAPD) technique. According to the CAPD technique, the indirect TOF sensor includes a CAPD pixel in which electrons are detected based on a difference in electric potentials by using a majority current created by applying a voltage to a substrate. Since the CAPD pixel is designed to use the majority current, the CAPD pixel can more quickly detect electrons formed at a deep depth, such that the CAPD method has superior efficiency.

FIG. 1 is a block diagram illustrating an example of an image sensing device ISD based on some implementations of the disclosed technology.

Referring to FIG. 1, the image sensing device ISD may measure the distance between the image sensing device ISD and a target object 1 using the TOF method. The image sensing device ISD may include a light source 10, a lens module 20, a pixel array 30, and a control block 40.

The light source 10 may emit light to a target object 1 upon receiving a light modulation signal MLS from the control block 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source combined with a white lamp or a monochromator, and a combination of other laser sources. For example, the light source 10 may emit infrared light having a wavelength of 800 nm to 1000 nm. Light emitted from the light source 10 may be light (i.e., modulated light) modulated by a predetermined frequency. Although FIG. 1 shows only one light source 10 for convenience of description, the scope or spirit of the disclosed technology is not limited thereto, and a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in a two-dimensional (2D) matrix structure in which unit pixels are arranged in a column direction and a row direction perpendicular to the column direction. The unit pixel (PX) may be a minimum unit that is repeatedly arranged in the same shape within the pixel array.

The unit pixels (PXs) may be formed over a semiconductor substrate. Each unit pixel (PX) may convert incident light received through the lens module 20 into an electrical signal corresponding to the amount of incident light, and may thus output a pixel signal using the electrical signal. In this case, the pixel signal may not indicate the color of the target object 1, and may be a signal indicating the distance to the target object 1.

Each unit pixel (PX) may be a Current-Assisted Photonic Demodulator (CAPD) pixel. The structure and operations of each unit pixel (PX) will hereinafter be described with reference to the drawings from FIG. 2.

The control block 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control block 40 may include a row driver 41, a demodulation driver 42, a light source driver 43, a timing controller 44, and a readout circuit 45.

The row driver 41 may drive unit pixels (PXs) of the pixel array in response to a timing signal generated from the timing controller 44. For example, the row driver 41 may generate a control signal capable of selecting and controlling at least one row line from among the plurality of row lines. The control signal may include a reset signal RST for controlling a reset transistor, a transmission signal TRG for controlling transmission of photocharges accumulated in a detection region, a floating diffusion signal FDG for providing additional electrostatic capacity at a high illuminance level, a selection signal SEL for controlling a selection transistor, a drain transistor control signal DRS for removing noise photocharges by controlling a drain transistor, and the like.

Although FIG. 1 illustrates the row driver 41 arranged in a column direction (i.e., a vertical direction) of the pixel array 30 for convenience of description, at least some parts of the row driver 41 may be arranged in a row direction (i.e., a horizontal direction) of the pixel array 30.

The demodulation driver 42 may generate a demodulation control signal capable of selecting and controlling at least one row line from among the plurality of row lines in response to a timing signal generated from the timing controller 44. The demodulation control signal may generate a hole current in the substrate.

The light source driver 43 may generate a light modulation signal MLS capable of driving the light source 10 in response to a control signal from the timing controller 44. The light modulation signal MLS may be a signal that is modulated by a predetermined frequency.

The timing controller 44 may generate a timing signal to control the row driver 41, a demodulation driver 42, the light source driver 43, and the readout driver 45.

The readout driver 45 may process pixel signals received from the pixel array 30 under control of the timing controller 44, and may thus generate pixel data formed in a digital signal shape. To this end, the readout driver 45 may include a correlated double sampler (CDS) circuit for performing correlated double sampling (CDS) on the pixel signals generated from the pixel array 30.

In addition, the readout driver 45 may include an analog-to-digital converter (ADC) for converting output signals of the CDS circuit into digital signals. In addition, the readout driver 45 may include a buffer circuit that temporarily stores pixel data generated from the analog-to-digital converter (ADC) and outputs the pixel data under control of the timing controller 44. In the meantime, since the pixel array 30 includes CAPD pixels, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a predetermined frequency to a scene captured by the image sensing device ISD. The image sensing device ISD may sense modulated light (i.e., incident light) reflected from the target objects 1 included in the scene, and may thus generate depth information for each unit pixel (PX).

A time delay based on the distance between the image sensing device ISD and each target object 1 may occur between the modulated light and the incident light. The time delay may be denoted by a phase difference between the signal generated by the image sensing device ISD and the light modulation signal MLS controlling the light source 10. An image processor (not shown) may calculate a phase difference generated in the output signal of the image sensing device ISD, and may thus generate a depth image including depth information for each unit pixel (PX).

Figure 2:
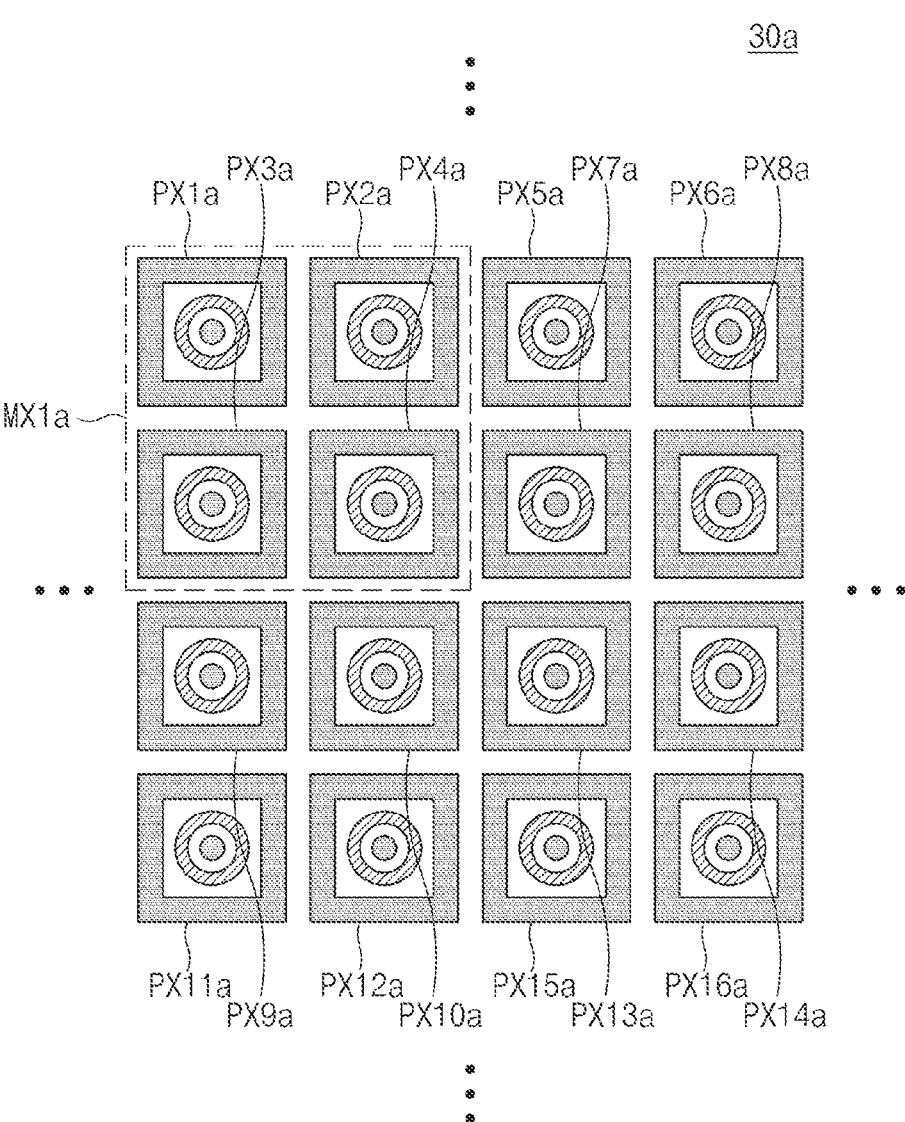
FIG. 2 is a schematic diagram illustrating an example of a pixel array based on some implementations of the disclosed technology.

FIG. 2 is a schematic diagram illustrating an example of a pixel array 30a based on some implementations of the disclosed technology.

Although FIG. 2 exemplarily illustrates that the pixel array 30a includes 16 unit pixels PX1a~PX16a that are arranged in a matrix array including four rows and four columns, other implementations are also possible. Thus, the pixel array 30a can include an arbitrary number of unit pixels.

Figure 3:
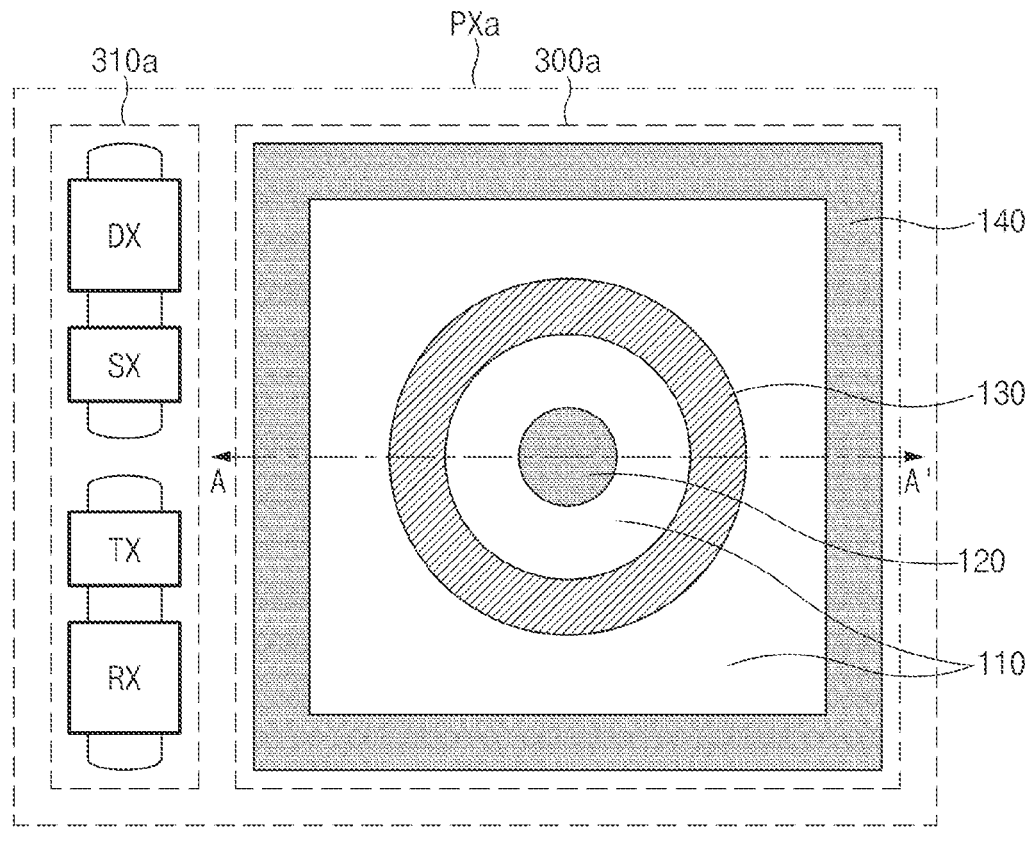
FIG. 3 is a schematic diagram illustrating an example of a unit pixel included in the pixel array shown in FIG. 2 based on some implementations of the disclosed technology.
Figure 4:
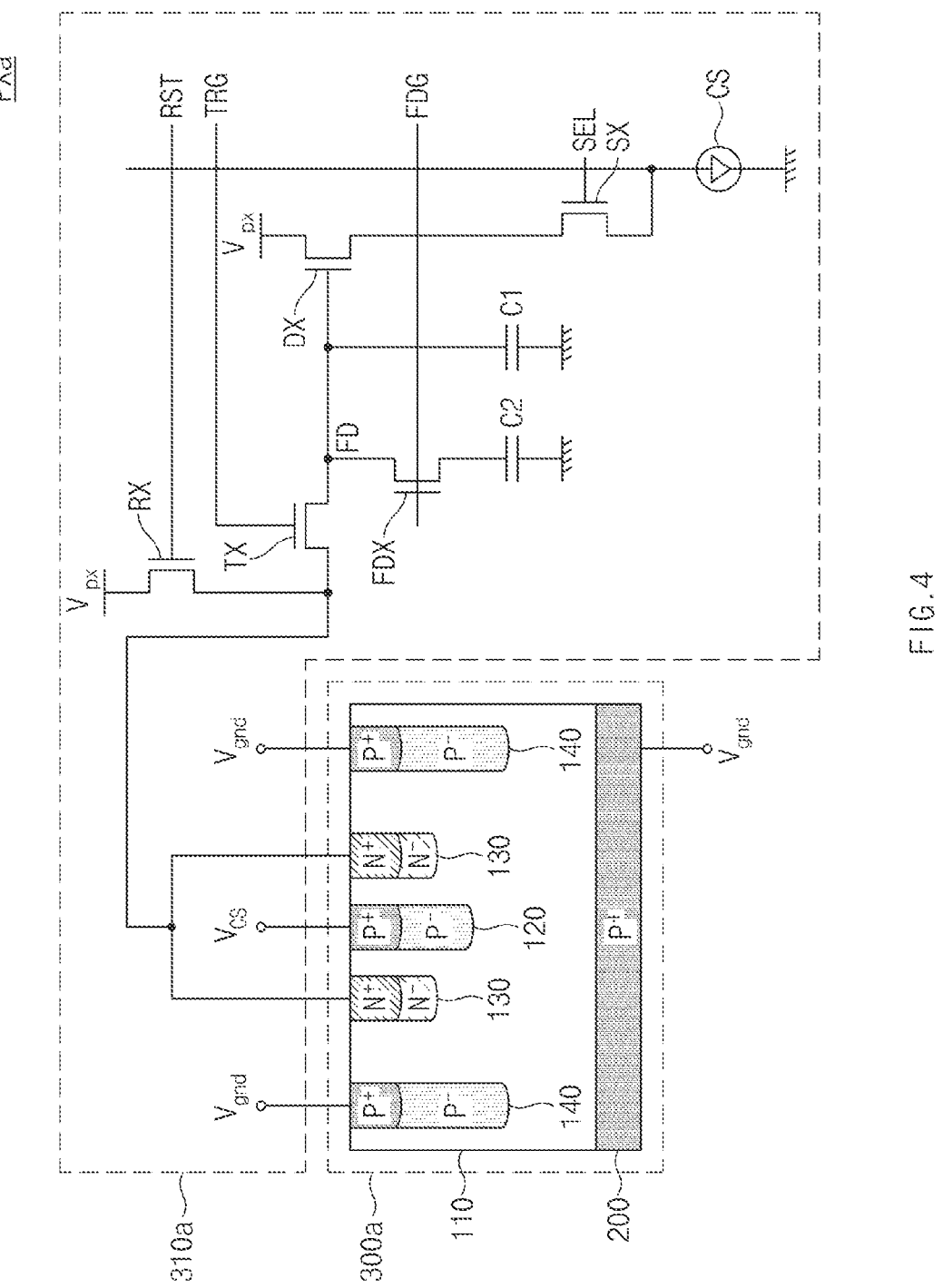
FIG. 4 is a schematic diagram illustrating the connection relationship between a cross-section of the unit pixel taken along a first cutting line shown in FIG. 3 and constituent elements included in the unit pixel based on some implementations of the disclosed technology.

FIG. 2 illustrates the arrangement of the unit pixels PX1a~PX16a and FIGS. 3 and 4 illustrate structures and connections of elements (e.g., a photoelectric conversion region, a control region, a detection region, a guard ring region, a pixel transistor, etc.) included in each of the unit pixels PX1a~PX16a.

The respective unit pixels included in the pixel array 30a may be denoted by the first to sixteenth unit pixels PX1a~PX16a.

In the example as shown in FIG. 2, four unit pixels (e.g., PX1a~PX4a) included in the pixel array 30a may construct a (2×2) matrix array (e.g., MX1a). The (2×2) matrix array including first to fourth unit pixels PX1a~PX4a may hereinafter be referred to as a first unit matrix MX1a.

A demodulation control signal having a phase difference with respect to the modulated light may be applied to each of the unit pixels PX1a~PX4a included in the first unit matrix MX1a.

The demodulation control signal ($V_{cs}$) may be a signal that periodically transits from an activation voltage to a deactivation voltage and is applied to a control region included in each unit pixel.

For example, a demodulation control signal having no phase difference (i.e., a phase difference=0 rad) with respect to the modulated light may be applied to the first unit pixel PX1a. In addition, a demodulation control signal having a phase difference of π rad with respect to the modulated light may be applied to the second unit pixel PX2a. A demodulation control signal having a phase difference of π/2 rad with respect to the modulated light may be applied to the third unit pixel PX3a. In addition, a demodulation control signal having a phase difference of 3π/2 rad with respect to the modulated light may be applied to the fourth unit pixel PX4a.

The four adjacent unit pixels included in the pixel array 30a may sense incident light at a time point where a demodulation control signal applied to each unit pixel has an activation voltage with respect to the incident light.

In addition, the unit pixels to which the demodulation control signal having the same phase are applied may be repeatedly arranged in the pixel array 30a. For example, the first unit pixel PX1a, the fifth unit pixel PX5a, the ninth unit pixel PX9a, and the thirteenth unit pixel PX13a may receive the demodulation control signal having the same phase.

The unit pixels PX1a~PX16a included in the pixel array 30a may sense incident light of the image sensing device ISD during the detection time. During the detection time, incident light is incident upon the image sensing device ISD, and a demodulation signal is applied to the unit pixels PX1a~PX16a included in the pixel array 30a. During the detection time, the unit pixels PX1a~PX16a can detect photocharges corresponding to the incident light that is incident upon the image sensing device ISD at a time point when the demodulation control signal having an activation voltage is applied to the image sensing device ISD.

When the activation voltage is applied to the control region, a hole current may occur such that a detection region adjacent to the control region can capture charges. For example, the activation voltage may be set to 1.2 V.

When the deactivation voltage is applied to the control region, a hole current may not occur such that a detection region adjacent to the control region does not capture charges. For example, the deactivation voltage may be set to zero volts (0V). The demodulation control signal may control the activation voltage or the deactivation voltage to be applied to the control region according to a predetermined period.

In some implementations of the disclosed technology, the demodulation driver 42 may simultaneously transmit a demodulation control signal having an activation voltage to the adjacent unit pixels (e.g., PX1a and PX3a), such that the unit pixels (e.g., PX1a and PX3a) can reduce a photocharge detection time corresponding to incident light.

The photoelectric conversion regions respectively included in the unit pixels PX1a~PX16a may generate photocharges corresponding to incident light. The image processor (not shown) may acquire distance information between the image sensing device ISD and the target object 1 using a pixel signal corresponding to the generated photocharges.

Each of the unit pixels PX1a~PX16a may receive a demodulation control signal that has a phase difference of a predetermined phase (i.e., angle) with respect to the modulated light during the detection time. The image sensing device ISD may detect a pixel signal for each of the unit pixels PX1a~PX16a according to a demodulation signal applied thereto.

The demodulation signal applied to each of the unit pixels PX1a~PX4a included in the first unit matrix MX1a will be described later with reference to FIG. 6.

The unit pixels to which the demodulation control signal having the same phase as the modulated light is applied may be repeatedly arranged at predetermined positions in the pixel array 30a. For example, a demodulation control signal having no phase difference with respect to the modulated light may be applied to the unit pixels (e.g., PX1a, PX5a, PX9a, and PX13a) that are respectively located at first-row-and-first-column positions of the (2×2) matrices. Each of the (2×2) matrices includes four unit pixels and the (2×2) matrices may be arranged in the pixel array 30a without overlapping each other.

Therefore, the operation for detecting light incident upon the respective unit pixels PX1a~PX4a included in the first unit matrix MX1a can also be substantially and equally applied to another (2×2) matrix (e.g., a (2×2) matrix including the fifth to eighth unit pixels PX5a~PX8a) included in the pixel array 30a.

FIG. 3 is a schematic diagram illustrating an example of the unit pixel included in the pixel array 30a shown in FIG. 2 based on some implementations of the disclosed technology.

The unit pixels PX1a~PX16a included in the pixel array 30a may be identical in structure to each other.

The unit pixel (PXa) included in the pixel array 30a may include a sensing region 300a and a transistor region 310a. The sensing region 300a may include a photoelectric conversion region 110, a control region 120, detection regions 130, and guard ring regions 140. The transistor region 310a may include a drive transistor DX, a transfer transistor TX, a selection transistor SX, a reset transistor RX, and a floating diffusion (FD) region (not shown).

In each unit pixel (PXa), the photoelectric conversion region 110 is a photosensitive region that is structured to convert incident light into photocharges and to extend throughout the majority of the sensing region 300a; the control region 120 for receiving a demodulation control signal and may be located in the sensing region 300a; the detection region 130 is spatially separated from the control region 120 for capturing photocharges in a charge current in response to the demodulation control signal; and the guard ring region 140 is located and shaped for surrounding both the control and detection regions 120 and 130. The transfer transistor TX in the transistor region 310a is electrically coupled for controlling transmission of photocharges accumulated in the detection region 130 into the floating diffusion region (FD), and the drive transistor DX is coupled to the FD region to convert the photocharges in the FD region into an electrical signal corresponding to the received photocharges in the FD region and to amplify the electrical signal. The selection transistor SX is coupled between the drive transistor DX and a signal line for transmitting the output electrical signal of the drive transistor DX to the signal line. As illustrated in the example in FIG. 4, the reset transistor RX is coupled between the detection region 130 and the transfer transistor TX for resetting the unit pixel (PXa) to a pixel voltage ($V_{px}$).

The photoelectric conversion region 110 may be formed over a semiconductor substrate. For example, the semiconductor substrate may be or include a monocrystalline silicon substrate in some implementations. The substrate may be implemented in various ways, including, for example, a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate. In the specific embodiments disclosed below, it is assumed that the substrate is a silicon substrate doped with P-type impurities where a charge current generated in the photoelectric conversion region 110 and detected by the detection region 130 is a hole current carrying holes as charge carriers. In other implementations, the substrate for the disclosed devices may be a substrate doped with N-type impurities where the charge current is an electron current carrying electrons as charge carriers.

The photoelectric conversion regions 110 may be arranged in each of the unit pixels (PXa). Alternatively, only one photoelectric conversion region 110 may be disposed in all of the unit pixels (PXa) included in the pixel array 30a.

The photoelectric conversion region 110 may be arranged to occupy a space within the unit pixel (Pxa) as large as possible to increase light reception (Rx) efficiency of the unit pixel (PXa).

The photoelectric conversion region 110 may receive incident light, and may generate photocharges corresponding to the received incident light.

The control region 120 may be disposed at a center portion of the photoelectric conversion region 110. The control region 120 may be doped with P-type impurities. In this case, the control region 120 may have a higher doping density than the substrate.

Although the control region 120 doped with such impurities is formed in a circular shape when viewed from a direction perpendicular to one surface of the substrate, other implementations are also possible. Thus, the control region 120 can have other shapes than the circular shape as long as a charge current (e.g., a hole current) can easily and uniformly occur in the entire substrate of the unit pixels (PXa). For example, the control region 120 may be formed in a polygonal shape such as a square shape or an octagonal shape.

A demodulation control signal having an activation voltage is applied to the control region 120 and a hole current may occur in the substrate. The hole current may be generated by movement of a semiconductor hole. In some implementations, the hole current may be generated by applying a voltage to a P-type doped semiconductor substrate.

In some implementations, a hole current may be generated between the control region 120 and the guard ring region 140.

The hole current may move photocharges generated in the photoelectric conversion region 110. Since the photocharges move along the hole current, the unit pixel (PXa) can easily detect the generated photocharges.

The detection region 130 can detect photocharges moving along the hole current. The detection region 130 may be doped with N-type impurities. In some implementations, the detection region 130 may be formed to surround the control region 120. The detection region 130 may be formed adjacent to the control region 120, such that the detection region 130 can easily capture photocharges that move due to a hole current generated between the control region 120 and the guard ring region 140.

Although FIG. 3 shows that the detection region 130 has a circular shape, other implementations are also possible as long as the detection region 130 can easily capture photocharges moving along the hole current. For example, the detection region 130 may be formed in a polygonal shape such as a square shape or an octagonal shape.

In some implementations, each unit pixel (PXa) may include a single control region 120 and a single detection region 130.

The guard ring region 140 may be formed to surround the control region 120. In addition, the guard ring region 140 may be doped with P-type impurities. In addition, the guard ring region 140 may have a higher doping density than the substrate.

In some implementations, the guard ring region 140 may be formed in a square (or rectangular) shape. The guard ring region 140 can have other shapes than the square shape as long as the guard ring region 140 can surround the control region 120. For example, the guard ring region 140 may be formed in a circular shape, or may also be formed in a polygonal shape such as an octagonal shape as needed.

The guard ring region 140 may receive a ground voltage ($V_{gnd}$) as an input. For example, the ground voltage may be zero volts (0V). The ground voltage ($V_{gnd}$) may have the same voltage as the deactivation voltage of the demodulation control signal.

When the demodulation control signal having the deactivation voltage is applied to the control region 120, a hole current may not occur in the photoelectric conversion region 110, the. When the demodulation control signal having the activation voltage is applied to the control region 120, the hole current occurs and a flow of the hole current may occur between the guard ring region 140 and the control region 120.

Each of the unit pixels (PXa) may include the guard ring region 140 to control the hole current flowing between the control regions 120 of the adjacent unit pixels (PXa).

For example, during the operation of the adjacent unit pixels (PXa), the activation voltage and the deactivation voltage can be applied to the control regions 120 respectively included in the unit pixels (PXa).

Assuming that there is no guard ring region in unit pixels, when the activation voltage and the deactivation voltage are applied to the control regions 120 of the adjacent unit pixels (PXa), a hole current may occur between the control regions 120 of the adjacent unit pixels (PXa).

Thus, when the guard ring region 140 does not exist, photocharges generated from the unit pixel (PXa) including the control region 120 receiving the deactivation voltage can be detected from the detection region 130 of the unit pixel (PXa) including the control region 120 receiving the activation voltage.

When photocharges generated from the unit pixel (PXa) receiving the deactivation voltage are detected from the unit pixel (PXa) receiving the activation voltage, noise may occur in a pixel signal generated from the unit pixel (PXa) receiving the activation voltage.

Due to the noise, an accurate phase difference detection and an accurate distance calculation become more difficult. Some implementations of the disclosed technology suggest including the guard ring region 140 in the unit pixel (PXa). By having the guard ring region 140, the unit pixel (PXa) can control the flow of the hole current generated in the unit pixel (PXa).

The guard ring region 140 may reduce or prevent the flow of the hole current generated between the adjacent unit pixels (PXa). As the hole current flowing between the adjacent unit pixels (PXa) is reduced, there is a lower possibility that photocharges generated from the unit pixel (PXa) receiving the deactivation voltage move to the other unit pixel (PXa) receiving the activation voltage, resulting in reduction in noise generated from the pixel signal.

In addition, since the guard ring region 140 is formed, the demodulation control signals, each of which has the activation voltage, can be simultaneously applied to the adjacent unit pixels (PXa). In this case, although photocharges are simultaneously detected in the sensing regions 300a of different unit pixels (PXa), crosstalk between signals may not occur or can be reduced or prevented. Since each of the unit pixels (PXa) includes the guard ring region 140, photocharges generated from the respective unit pixels (PXa) can be detected while being classified according to the respective unit pixels (PXa).

The transistor region 310a includes the transfer transistor TX, the drive transistor DX, the selection transistor SX, the reset transistor RX, and a floating diffusion (FD) region (not shown). In addition, the transistor region 310a may include a signal line (not shown) and a capacitor (not shown), etc. that is connected to the above-mentioned transistors. A detailed connection relationship between the circuits included in the transistor region 310a will be described later with reference to FIG. 4.

The reset transistor RX may be activated in response to a reset signal, such that the reset transistor RX may reset the potential of each unit pixel (PXa) to a predetermined level (e.g., a pixel voltage level).

In addition, when the reset transistor RX is activated, the transfer transistor TX may also be activated to reset a floating diffusion (FD) region (not shown).

Since the transfer transistor TX is activated in response to a transmission (Tx) signal, the transfer transistor TX can transmit photocharges accumulated in the detection region 130 to the floating diffusion (FD) region (not shown).

The drive transistor DX may receive a pixel voltage through a drain terminal thereof, and may be coupled to the floating diffusion (FD) region (not shown) through a gate terminal thereof. In addition, the drive transistor DX may be coupled to the selection transistor SX through a source terminal thereof.

The drive transistor DX may output a current corresponding to the potential of the floating diffusion (FD) region coupled to a gate electrode thereof to a signal line through the selection transistor SX.

The selection transistor SX may be activated in response to a selection signal applied to a gate electrode thereof, such that the selection transistor SX may transmit an output signal of the drive transistor DX to a signal line.

The reset signal, the transmission signal, and the selection signal may be supplied from the row driver 41 shown in FIG. 1.

FIG. 4 is a schematic diagram illustrating the connection relationship between a cross-section of the unit pixel (PXa) taken along a first cutting line A-A' shown in FIG. 3 and constituent elements included in the unit pixel (PXa) based on some implementations of the disclosed technology.

In FIG. 4, the structure and operations of the unit pixel (PXa) will hereinafter be described with reference to the cross-sectional view of the unit pixel (PXa) taken along the first cutting line A-A' shown in FIG. 3 and a plurality of circuits connected to the corresponding region (e.g., the sensing region 300). The region in which the circuits connected to the sensing region 300a are located will hereinafter be referred to as a transistor region 310a.

Referring to FIG. 3, the sensing region 300a may include the photoelectric conversion region 110, the control region 120, the detection region 130, and the guard ring region 140. In addition, the sensing region 300a may include a passivation layer 200 formed over the semiconductor substrate. The passivation layer 200 may be formed by doping P-type impurities over the semiconductor substrate.

A ground voltage ($V_{gnd}$) may be applied to the passivation layer 200. For example, the ground voltage ($V_{gnd}$) may be zero volts (0V).

Since the ground voltage ($V_{gnd}$) is applied to the passivation layer 200, flow of a hole current may occur between the control region 120 receiving the activation voltage and the passivation layer 200. In addition, photocharges generated by the photoelectric conversion region 110 may move along flow of the hole current.

In some implementations, the control region 120 may include P-type impurity regions having different doping densities. For example, a P-type impurity region (i.e., P⁻ region) having a relatively low doping density may be implanted into the substrate to a first depth, and a P-type impurity region (i.e., P⁺ region) having a relatively high doping density may be implanted into the substrate to a second depth at the same position as the above P⁻-type impurity implantation position. In this case, the first depth may be greater than the second depth.

The detection region 130 may include N-type impurity regions having different doping densities. For example, the N-type impurity region (i.e., N⁻ region) having a relatively lower doping density may be implanted into the substrate to a third depth, and the N-type impurity region (i.e., N⁺ region) having a relatively higher doping density may be implanted into the substrate to a fourth depth at the same position as the above N⁻-type impurity implantation position. In addition, the first depth may be greater than the third depth. The depth where photocharges are captured in the detection region 130 can be adjusted in response to a change in the third depth. The third depth and the fourth depth may be changed depending on the position of a hole current generated between the guard ring region 140 and the control region 120.

The guard ring region 140 may include P-type impurity regions having different doping densities. For example, a P-type impurity region (i.e., P⁻ region) having a relatively lower doping density may be implanted into the substrate to a fifth depth, and the P-type impurity region (i.e., P⁺ region) having a relatively higher doping density may be implanted into the substrate to a sixth depth at the same position as the above P⁻-type impurity implantation position. In this case, the fifth depth may be greater than the sixth depth.

At this time, the fifth depth may be greater than the first depth. As the fifth depth is greater than the first depth, movement (or flow) of photocharges between adjacent unit pixels (PXa) can be controlled by the guard ring region 140.

The guard ring region 140 may receive the ground voltage (Vgnd). Since the demodulation control signal ($V_{cs}$) is applied to the control region 120, flow of a hole current may occur between the guard ring region 140 and the control region 120. Information about whether a hole current flow occurs may be determined in response to a potential difference between the ground voltage ($V_{gnd}$) applied to the guard ring region 140 and the voltage of the demodulation control signal ($V_{cs}$) applied to the control region 120.

For example, the activation voltage of the demodulation control signal ($V_{cs}$) may be set to 1.2 V, and the deactivation voltage may be set to zero volts (0V). If the ground voltage ($V_{gnd}$) is zero volts (0V), flow of a hole current may occur between the control region 120 and the guard ring region 140 when the activation voltage is applied to the control region 120.

The detection region 130 may capture and accumulate photocharges. The transistor region 310a may include a plurality of elements for processing photocharges captured by the detection region 130 and converting the processed photocharges into electrical signals.

The control signals RST, TRG, FDG, and SEL applied to the plurality of elements may be supplied from the row driver 41. In addition, the pixel voltage ($V_{gx}$) may be a power-supply voltage VDD or a source voltage VSS.

The elements for processing the photocharges captured by the detection region 130 will hereinafter be described in detail with reference to the attached drawings. The transistor region 310a may include a reset transistor RX, a transfer transistor TX, a first capacitor C1, a second capacitor C2, a floating diffusion transistor FDX, a drive transistor DX, and a selection transistor SX.

The reset transistor RX may be activated in response to a logic high level of the reset signal RST supplied to a gate electrode thereof, such that potential of the floating diffusion region FD and potential of the detection region 130 may be reset to a predetermined level (e.g., the pixel voltage $V_{px}$). In addition, when the reset transistor RX is activated (i.e., active state), the transfer transistor TX can also be activated (i.e., active state) to reset the floating diffusion region (FD).

The transfer transistor TX may be activated (i.e., active state) in response to a logic high level of the transmission signal TRG supplied to a gate electrode thereof, such that photocharges accumulated in the detection region 130 can be transmitted to the floating diffusion region (FD).

The first capacitor C1 may be coupled to the floating diffusion region (FD), such that the first capacitor C1 can provide predefined electrostatic capacity.

The second capacitor C2 may be selectively coupled to the floating diffusion region (FD) according to operations of the floating diffusion transistor FDX, such that the second capacitor C2 can provide additional predefined electrostatic capacity.

Each of the first capacitor C1 and the second capacitor C2 may include, for example, at least one of a Metal-Insulator-Metal (MIM) capacitor, a Metal-Insulator-Polysilicon (MIP) capacitor, a Metal-Oxide-Semiconductor (MOS) capacitor, and a junction capacitor.

The floating diffusion transistor FDX may be activated (i.e., active state) in response to a logic high level of the floating diffusion signal FDG supplied to a gate electrode thereof, such that the floating diffusion transistor FDX may couple the second capacitor C2 to the floating diffusion region FD.

For example, when the amount of incident light is sufficient to correspond to a relatively high illuminance condition, the row driver 41 may activate the floating diffusion transistor FDX, such that the floating diffusion transistor FDX enters the active state and the floating diffusion region FD can be coupled to the second capacitor C2. As a result, when the amount of incident light is sufficient to correspond to a high illuminance level, the floating diffusion region FD can accumulate much more photocharges therein, which makes it possible to guarantee a high dynamic range (HDR).

When the amount of incident light is not sufficient and thus corresponds to a relatively low illuminance level, the row driver 41 may control the floating diffusion transistor FDX to be deactivated (i.e., inactive state), such that the floating diffusion region FD can be isolated from the second capacitor C2.

In some other implementations, the floating diffusion transistor FDX and the second capacitor C2 may be omitted as necessary.

A drain electrode of the drive transistor DX is coupled to the pixel voltage (Vpx) and a source electrode of the drive transistor DX is coupled to a vertical signal line SL through the selection transistor SX, such that a load (MOS) and a source follower circuit of a constant current source circuit CS coupled to one end of the vertical signal line SL can be constructed. Thus, the drive transistor DX may output a current corresponding to potential of the floating diffusion node FD coupled to a gate electrode to the vertical signal line SL through the selection transistor SX.

The selection transistor SX may be activated (i.e., active state) in response to a logic high level of the selection signal SEL supplied to a gate electrode thereof, such that the pixel signal generated from the drive transistor DX can be output to the vertical signal line SL.

The pixel signal applied to the vertical signal line SL through the transistor region 310a may be performed by noise cancellation and analog-to-digital (ADC) conversion processing, such that the pixel signal can be converted into image data.

The image processor (not shown) may calculate image data acquired from photocharges captured by the detection region 130 included in four adjacent unit pixels (PXa), and may thus calculate a phase difference using the calculated image data. The image processor (not shown) may calculate depth information indicating the distance to the target object 1 based on a phase difference corresponding to each pixel signal detected by each unit pixel (PXa), and may thus generate a depth image including the depth information corresponding to each pixel.

Figure 5:
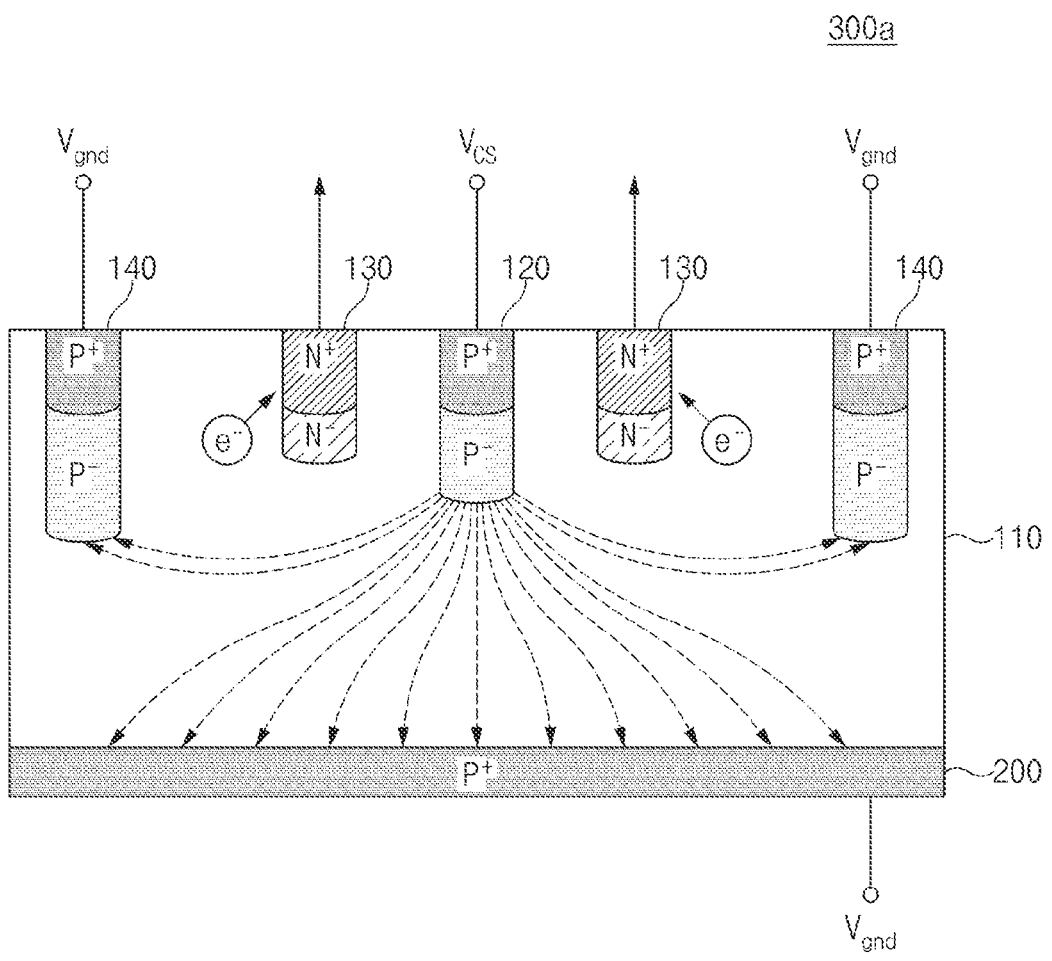
FIG. 5 is a conceptual diagram illustrating an example of a photocharge detection operation of the image sensing device including one or more guard ring regions based on some implementations of the disclosed technology.

FIG. 5 is a diagram illustrating an example of a photocharge detection operation of the image sensing device including one or more guard ring regions based on some implementations of the disclosed technology.

FIG. 5 illustrates the sensing region 300a so as to explain the photocharge detection operation of the image sensing device including the guard ring region 140.

When the demodulation control signal ($V_{cs}$) having the activation voltage (e.g., 1.2 V) is applied to the control region 120, a potential difference may occur between the control region 120 and the guard ring region 140, and flow of a hole current may also occur between the control region 120 and the guard ring region 140. In addition, when the demodulation control signal ($V_{cs}$) having the activation voltage is applied to the control region 120, flow of a hole current may occur between the control region 120 and the passivation layer 200.

Photocharges generated by the photoelectric conversion region 110 may move along flow of the hole current. The photocharges moving along the hole current may be captured by the detection region 130. In other words, the detection region 130 can easily capture the photocharges using the hole current.

Since the guard ring region 140 is formed, flow of the hole current may be formed for each sensing region 310a of each unit pixel (PXa). Flow of the hole current between the adjacent unit pixels (PXa) may be controlled to capture photocharges corresponding to different phase differences of the adjacent unit pixels (PXa). During the photocharge capture operation, the activation voltage can be applied to the adjacent unit pixels (PXa) at the same time.

Figure 6:
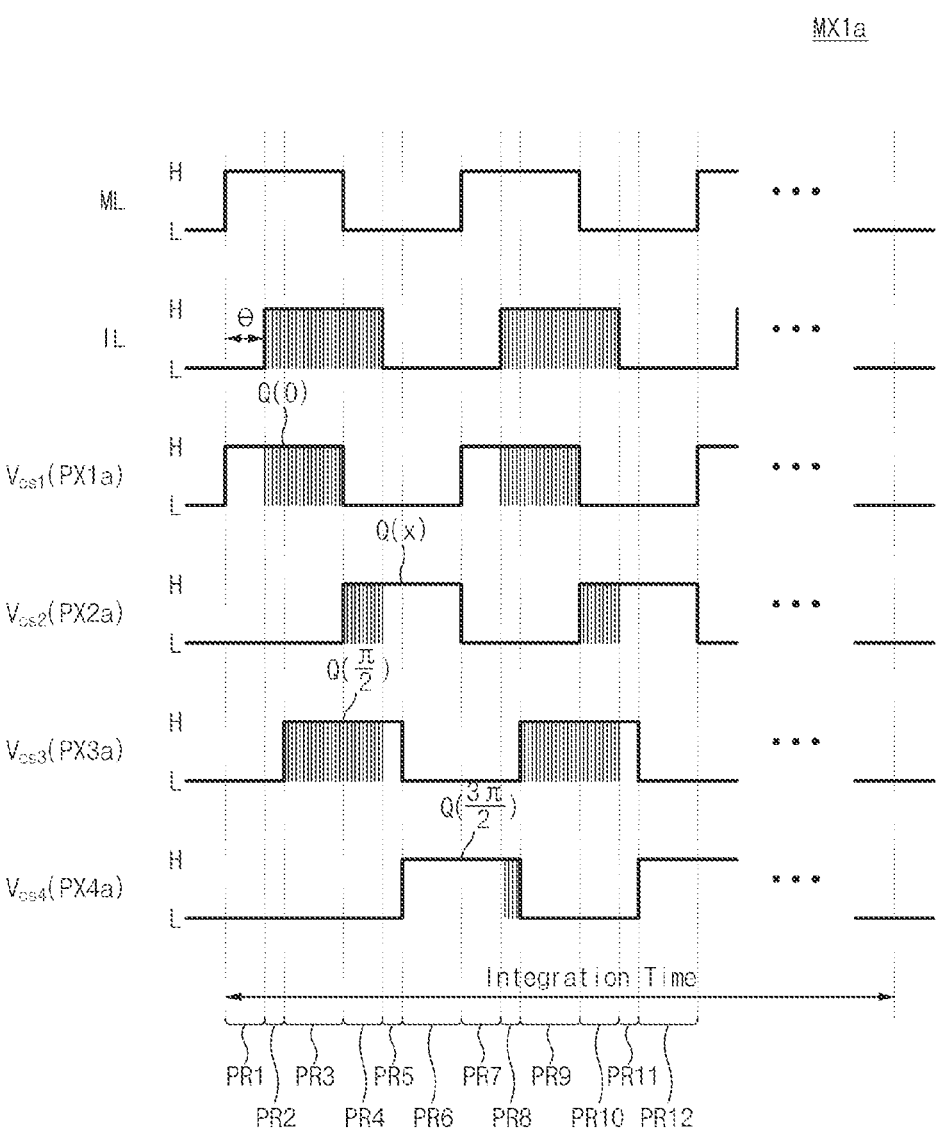
FIG. 6 is a timing diagram illustrating operations of the image sensing device based on some implementations of the disclosed technology.

FIG. 6 is a timing diagram illustrating operations of the image sensing device ISD based on some implementations of the disclosed technology.

The modulated light (ML), the incident light (IL), and the first to fourth demodulation control signals $V_{cs1}$~$V_{cs4}$ are illustrated in FIG. 6.

The unit pixels to which the demodulation control signal having the same phase is applied are repeatedly arranged in the pixel array 30a. The operation for detecting light incident upon the respective unit pixels PX1a~PX4a included in the first unit matrix MX1a can be substantially and equally applied to another (2×2) matrix (e.g., a (2×2) matrix including the fifth to eighth unit pixels PX5a~PX8a) included in the pixel array 30a. In FIG. 6, control signals applied to the unit pixels PX1a~PX4a included in the first unit matrix MX1a shown in FIG. 2 are shown as the example.

A demodulation control signal having different phase differences with respect to the modulated light (ML) may be applied to the first to fourth unit pixels PX1a~PX4a. For example, a demodulation control signal ($V_{cs1}$) having no phase difference (i.e., 0 rad) with respect to the modulated light (ML) may be applied to the first unit pixel PX1a. In some implementations, a demodulation control signal ($V_{cs2}$) having a phase difference (i.e., π rad) with respect to the modulated light (ML) may be applied to the second unit pixel PX2a. A demodulation control signal ($V_{cs3}$) having a phase difference (i.e., π/2 rad) with respect to the modulated light (ML) may be applied to the third unit pixel PX3a. In some implementations, a demodulation control signal ($V_{cs4}$) having a phase difference (i.e., 3π/2 rad) with respect to the modulated light (ML) may be applied to the fourth unit pixel PX4a.

The first demodulation control signal ($V_{cs1}$) may be applied to the control region 120 of the first unit pixel PX1a shown in FIG. 2. The second demodulation control signal ($V_{cs2}$) may be applied to the control region 120 of the second unit pixel PX2a shown in FIG. 2. The third demodulation control signal ($V_{cs3}$) may be applied to the control region 120 of the third unit pixel PX3a shown in FIG. 2. The fourth demodulation control signal ($V_{cs4}$) may be applied to the control region 120 of the fourth unit pixel PX4a shown in FIG. 2.

The first unit pixel PX1a may detect photocharges corresponding to incident light received at a time point where the demodulation control signal ($V_{cs1}$) has an activation voltage. The second unit pixel PX2a may detect photocharges corresponding to incident light received at a time point where the demodulation control signal ($V_{cs2}$) has an activation voltage. The third unit pixel PX3a may detect photocharges corresponding to incident light received at a time point where the demodulation control signal ($V_{cs3}$) has an activation voltage. The fourth unit pixel PX4a may detect photocharges corresponding to incident light received at a time point where the demodulation control signal ($V_{cs4}$) has an activation voltage.

As described above, the reset signal RST may reset each of the unit pixels PX1a~PX4a to a predetermined voltage (e.g., a pixel voltage $V_{px}$), and may have a logic high value from among a pixel reset time. If the reset signal RST has a logic high value, the reset transistor RX may be activated. Since the unit pixels PX1a~PX4a are reset by the reset signal RST having a logic high value, the unit pixels PX1a~PX4a can detect only photocharges corresponding to incident light during a detection time.

The transmission signal TRG may be used to transfer photocharges captured by the detection region 130 to the floating diffusion (FD) region, and may have a logic high value during the pixel reset time. As the transmission signal TRG has a logic high value, the floating diffusion region and the detection region of each unit pixel PX1a~PX4a can be coupled to each other and can also be reset by the reset transistor RX.

In addition, the transmission signal TRG may have a logic high value when photocharges move from the detection region 130 to the floating diffusion region FD during the detection time. After photocharges have moved through the transfer transistor TX, the photocharges accumulated in the floating diffusion region (FD) can be output as a pixel signal after passing through the drive transistor DX and the selection transistor SX.

After the photocharges accumulated in the floating diffusion region FD are output as the pixel signal, the row driver 41 may output the reset signal RST having a logic high value to the reset transistor RX. By the reset signal RST having a logic high value, each unit pixel can again detect the photocharges corresponding to the incident light.

Each of the unit pixels PX1a~PX4a may include the reset transistor RX and the transfer transistor TX. The reset signal RST and the transmission signal TRG may be applied to each of the unit pixels PX1a~PX4a.

The modulated light (ML) may refer to light that is emitted to the target object 1 by the light source 10 controlled by the control block 40. The modulated light (ML) may be generated to alternately have a high-level section (i.e., a period in which light is emitted) and a low-level section (i.e., a period in which light is not emitted).

The incident light (IL) may refer to light that is incident upon the substrate to generate electron-hole pairs through photoelectric conversion. The incident light (IL) may have a phase difference (θ) that is changed with the distance between the image sensing device ISD and the target object 1.

The level of each of the modulated light (ML) and the incident light (IL) shown in FIG. 6 may refer to the intensity of light. For example, "H" may refer to high-intensity light, and "L" may refer to low-intensity light.

While electrons generated by the incident light (IL) are captured in the detection region 130 included in each of the unit pixels PX1a~PX4a, each of the first demodulation control signal ($V_{cs1}$), the second demodulation control signal ($V_{cs2}$), the third demodulation control signal ($V_{cs3}$), and the fourth demodulation control signal ($V_{cs4}$) may alternately have a deactivation voltage (L) indicating a low level and an activation voltage (H) indicating a high level. For example, the activation voltage of each of the demodulation control signals $V_{cs1}$~$V_{cs4}$ may be set to 1.2 V, and the deactivation voltage of each of the demodulation control signals $V_{cs1}$~$V_{cs4}$ may be set to zero volts (0V).

In addition, the first demodulation control signal ($V_{cs1}$) may have the same phase as the modulated light (ML), the second demodulation control signal ($V_{cs2}$) may have a phase difference of 180° (π) with respect to the modulated light (ML), the third demodulation control signal ($V_{cs3}$) may have a phase difference of 90° (π/2) with respect to the modulated light (ML), and the fourth demodulation control signal ($V_{cs4}$) may have a phase difference of 270° (3π/2) with respect to the modulated light (ML).

In some implementations, it is assumed that no phase difference occurs between the light modulation signal MLS generating the modulated light (ML) and the modulated light (ML) for convenience of description, such that the light modulation signal MLS and the modulated light (ML) may have the same phase.

Each of the demodulation control signals $V_{cs1}$~$V_{cs4}$ may be configured in a manner that a deactivation voltage L indicating a low level and an activation voltage H indicating a high level are repeated at intervals of a predetermined time during the detection time, and the detection operation of the unit pixels PX1a~PX4a will hereinafter be described centering upon the first to twelfth periods PR1~PR12.

The first demodulation control signal ($V_{cs1}$) may have the activation voltage (H) in the first period PR1, the second period PR2, the third period PR3, the seventh period PR7, the eighth period PR8, and the ninth period PR9, and may have the deactivation voltage (L) in the remaining periods other than the above periods PR1~PR3 and PR7~PR9.

The second demodulation control signal ($V_{cs2}$) may have the activation voltage (H) in the fourth period PR4, the fifth period PRS, the sixth period PR6, the ninth period PR9, the eleventh period PR11, and the twelfth period PR12, and may have the deactivation voltage (L) in the remaining periods other than the above periods PR4~PR6, PR9, PR11, and PR12.

The third demodulation control signal ($V_{cs3}$) may have the activation voltage (H) in the third period PR3, the fourth period PR4, the fifth period PR5, the ninth period PR9, the tenth period PR10, and the eleventh period PR11, and may have the deactivation voltage (L) in the remaining periods other than the above periods PR3~PR5 and PR9~PR11.

The fourth demodulation control signal ($V_{cs4}$) may have the activation voltage (H) in the sixth period PR6, the seventh period PR7, the eighth period PR8, and the twelfth period PR12, and may have the deactivation voltage (L) in the remaining periods other than the above periods PR6~PR8 and PR12.

The first to fourth demodulation control signals $V_{cs1}$~$V_{cs4}$ respectively applied to the four adjacent unit pixels PX1a~PX4a may simultaneously have the activation voltage (H) in a specific period. For example, the first demodulation control signal ($V_{cs1}$) and the third demodulation control signal ($V_{cs3}$) may simultaneously have the activation voltage (H) in the third period PR3 and the ninth period PR9.

The guard ring region 140 included in each of the unit pixels PX1a~PX4a may control movement of photocharges between the adjacent unit pixels PX1a~PX4a, and the demodulation driver 42 may detect the photocharges by simultaneously applying the demodulation control signal having the activation voltage (H) to the adjacent unit pixels PX1a~PX4a.

The demodulation control signal may be applied to each unit pixel regardless of a voltage of the demodulation control signal applied to the adjacent unit pixels, such that the operation time of each unit pixel can be reduced.

The incident light (IL) having a phase difference (θ) with respect to the modulated light (ML) may be incident upon the substrate. For example, the incident light (IL) may have a high intensity (H) indicating a high level in the second period PR2, the third period PR3, the fourth period PR4, the eighth period PR8, the ninth period PR9, and the tenth period PR10.

Each of the first to fourth unit pixels PX1a~PX4a may capture photocharges generated by the incident light (IL) in a time period in which the demodulation control signals respectively applied to the first to fourth unit pixels PX1a~PX4a have the activation voltage (H).

The first unit pixel PX1a may capture photocharges generated by the incident light (IL) in the second period PR2, the third period PR3, the eighth period PR8, and the ninth period PR9.

The first demodulation control signal ($V_{cs1}$) applied to the first unit pixel PX1a may be configured in a manner that the activation voltage (H) and the deactivation voltage (L) are periodically repeated, such that the amount of photocharges that are captured by the first unit pixel PX1a in the second period PR2 and the third period PR3 may be identical to the amount of photocharges that are captured by the first unit pixel PX1a in the eighth period PR8 and the ninth period PR9. In this case, the photocharges captured by the first unit pixel PX1a in the second period PR2 and the third period PR3 may be defined as Q(0).

The second unit pixel PX2a may capture photocharges generated by the incident light (IL) in the fourth period PR4 and the tenth period PR10.

The second demodulation control signal ($V_{cs2}$) applied to the second unit pixel PX2a may be configured in a manner that the activation voltage (H) and the deactivation voltage (L) are periodically repeated, such that the amount of photocharges that are captured by the second unit pixel PX2a in the fourth period PR4 may be identical to the amount of photocharges that are captured by the second unit pixel PX2a in the tenth period PR10. In this case, the photocharges captured by the second unit pixel PX2a in the fourth period PR4 may be defined as Q(π).

The third unit pixel PX3a may capture photocharges generated by the incident light (IL) in the third period PR3, the fourth period PR4, the ninth period PR9, and the tenth period PR10.

The third demodulation control signal ($V_{cs3}$) applied to the third unit pixel PX3a may be configured in a manner that the activation voltage (H) and the deactivation voltage (L) are periodically repeated, such that the amount of photocharges that are captured by the third unit pixel PX3a in the third period PR3 and the fourth period PR4 may be identical to the amount of photocharges that are captured by the third unit pixel PX3a in the ninth period PR9 and the tenth period PR10. In this case, the photocharges captured by the third unit pixel PX3*a* in each of the third period PR3 and the fourth period PR4 may be defined as Q(π/2).

The fourth unit pixel PX4*a* may capture photocharges generated by the incident light (IL) in the eighth period PR8.

In this case, the photocharges captured by the fourth unit pixel PX4*a* in the eighth period PR8 may be defined as Q(3π/2).

The image sensing device ISD may perform the sensing operation and the distance information detection in units of four adjacent unit pixels (e.g., PX1*a*, PX2*a*, PX3*a*, and PX4*a*) included in a (2×2) matrix (e.g., a first unit matrix MX1*a*).

Although the above-mentioned timing diagram shown in FIG. 6 has been described for the first unit matrix MX1*a*, the timing diagram as shown in FIG. 6 can be applied to the four adjacent unit pixels included in another (2×2) matrix included in the pixel array 30*a*. Thus, the four adjacent unit pixels included in the pixel array 30*a* can perform substantially the same sensing operation and substantially the same distance information detection based on the timing diagram as shown in FIG. 6.

Each of the unit pixels (PXa) arranged in the pixel array 30*a* may receive any one of the first to fourth demodulation control signals $V_{cs1}$~$V_{cs4}$. In addition, the four adjacent unit pixels (PXa) arranged in the pixel array 30*a* may receive different demodulation control signals.

Each of the unit pixels (PXa) may output a pixel signal corresponding to photocharges that are applied to the floating diffusion (FD) region during a readout time indicating a signal detection time. The image processor (not shown) may acquire the distance from the image sensing device ISD to the target object 1 by processing the output pixel signal.

The image sensing device ISD may calculate a phase difference (θ) using the detected photocharges Q(0), Q(π/2), Q(π), and Q(3π/2).

The photocharges generated by incident light (IL) applied to the pixel array 30*a* may be divisionally captured by four unit pixels (e.g., PX1*a*, PX2*a*, PX3*a*, and PX4*a*) in different ways according to the respective phases.

Each of the first demodulation control signal $(V_{cs1})$ for acquiring the photocharges Q(0), the second demodulation control signal $(V_{cs2})$ for acquiring the photocharges Q(π), the third demodulation control signal $(V_{cs3})$ for acquiring the photocharges Q(π/2), and the fourth demodulation control signal $(V_{cs4})$ for acquiring the photocharges Q(3π/2) may have a phase difference of π/2 (90°), the image processor (not shown) may receive image data corresponding to Q(0), image data corresponding to Q(π), image data corresponding to Q(π/2), and image data corresponding to Q(3π/2) from the four adjacent unit pixels (e.g., PX1*a*, PX2*a*, PX3*a*, and PX4*a*), respectively.

The image processor (not shown) may calculate a phase difference based on the image data, and may acquire the distance from the image sensing device ISD to the target object 1.

Figure 7:
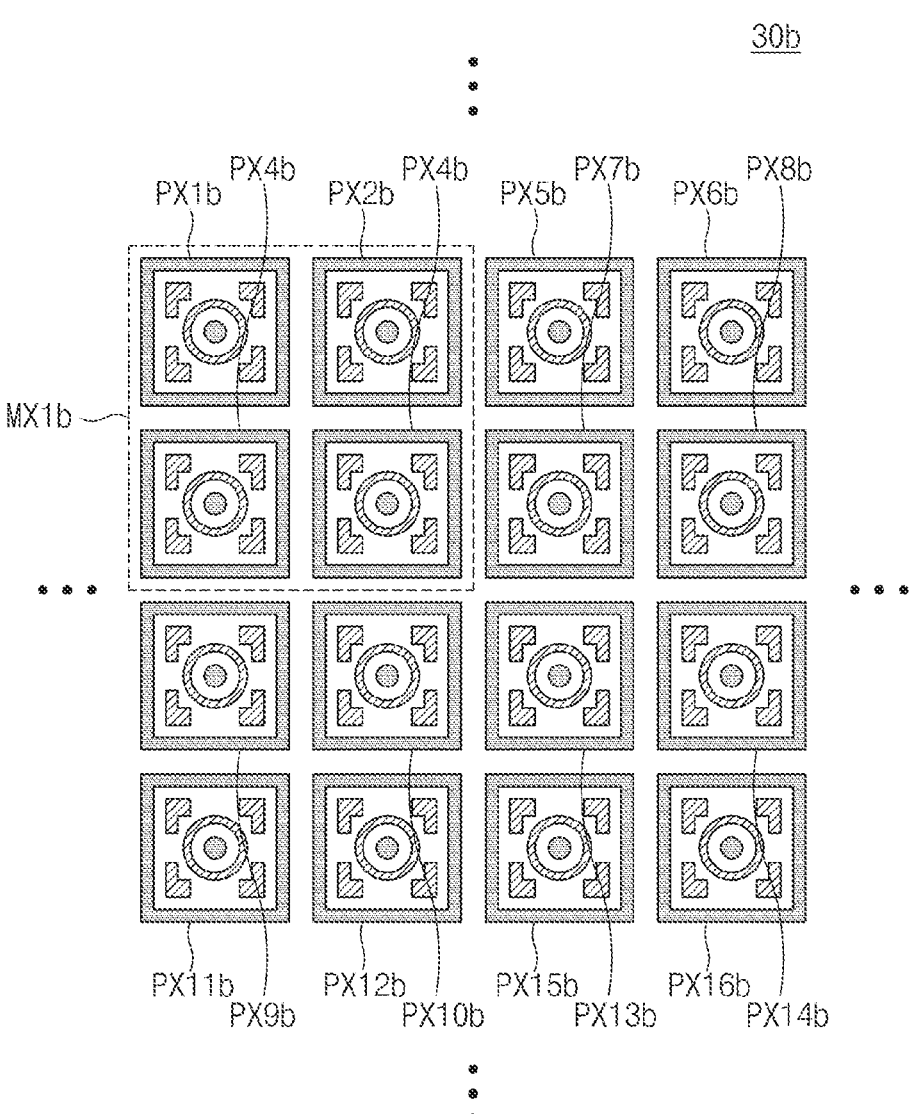
FIG. 7 is a schematic diagram illustrating an example of a pixel array based on some other implementations of the disclosed technology.

FIG. 7 is a schematic diagram illustrating an example of a pixel array 30*b* based on some other implementations of the disclosed technology.

Although FIG. 7 exemplarily illustrates that the pixel array 30*b* includes 16 unit pixels PX1*b*~PX16*b* that are arranged in a matrix array including four rows and four columns, other implementations are also possible. Thus, the pixel array 30*b* can include an arbitrary number of unit pixels.

Figure 8:
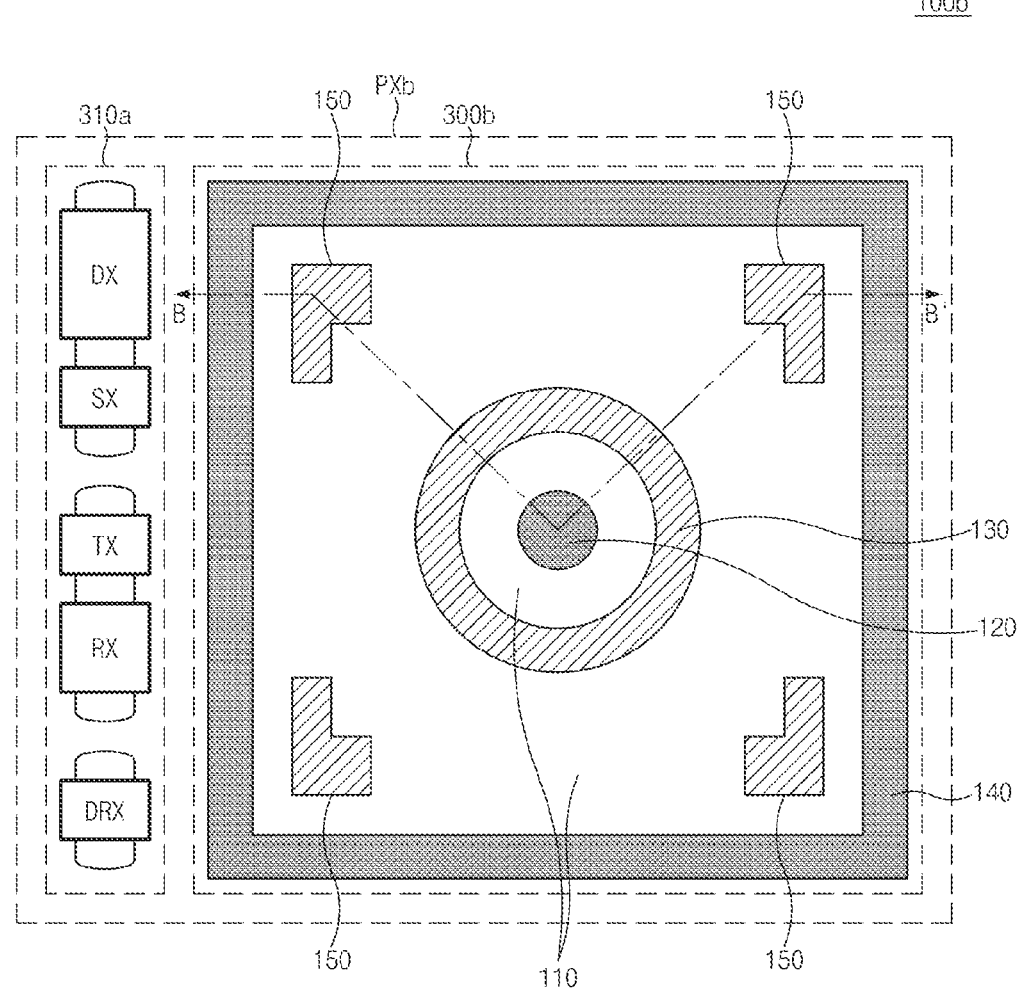
FIG. 8 is a schematic diagram illustrating an example of a unit pixel included in the pixel array shown in FIG. 7 based on some other implementations of the disclosed technology.
Figure 9:
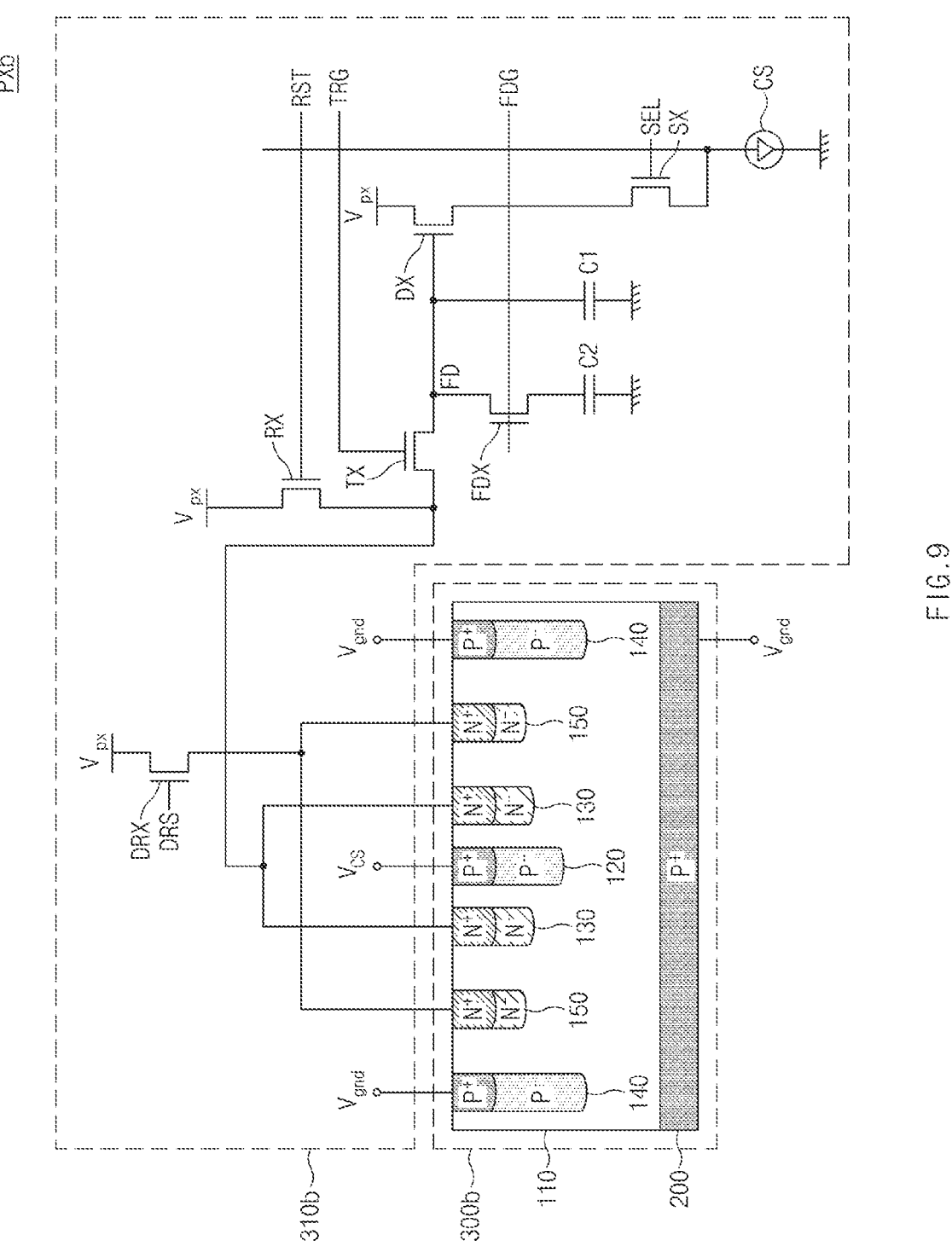
FIG. 9 is a schematic diagram illustrating the connection relationship between a cross-section of the unit pixel taken along a second cutting line shown in FIG. 8 and constituent elements included in the unit pixel based on some implementations of the disclosed technology.

FIG. 7 illustrates the arrangement of the unit pixels PX1*b*~PX16*b* and FIGS. 8 and 9 illustrate structures and connection of elements (e.g., a photoelectric conversion region, a control region, a detection region, a guard ring region, a pixel transistor, etc.) included in each of the unit pixels PX1*b*~PX16*b*.

The respective unit pixels included in the pixel array 30*b* may be denoted by the first to sixteenth unit pixels PX1*b*~PX16*b*.

In the example as shown in FIG. 7, four unit pixels (e.g., PX1*b*~PX4*b*) included in the pixel array 30*b* may construct the (2×2) matrix array (e.g., MX1*b*). The (2×2) matrix array including the first to fourth unit pixels PX1*b*~PX4*b* may hereinafter be referred to as a first unit matrix MX1*b*.

A demodulation control signal having a phase difference with respect to the modulated light may be applied to each of the unit pixels PX1*b*~PX4*b* included in the first unit matrix MX1*b*, such that each unit pixel can sense the incident light (e.g., the modulated light reflected from the target object) corresponding to the demodulation control signal.

The demodulation control signal $(V_{cs})$ may be a signal that periodically transits from an activation voltage to a deactivation voltage and is applied to a control region included in each unit pixel.

For example, a demodulation control signal having no phase difference (i.e., a phase difference=0 rad) with respect to the modulated light may be applied to the first unit pixel PX1*b*. In addition, a demodulation control signal having a phase difference of n rad with respect to the modulated light may be applied to the second unit pixel PX2*b*. A demodulation control signal having a phase difference of π/2 rad with respect to the modulated light may be applied to the third unit pixel PX3*b*. In addition, a demodulation control signal having a phase difference of 3π/2 rad with respect to the modulated light may be applied to the fourth unit pixel PX4*b*.

The four adjacent unit pixels included in the pixel array 30*a* may sense incident light at a time point where a demodulation control signal applied to each unit pixel has an activation voltage with respect to the incident light.

In addition, the unit pixels to which the demodulation control signal having the same phase are applied may be repeatedly arranged in the pixel array 30*b*. For example, the first unit pixel PX1*b*, the fifth unit pixel PX5*b*, the ninth unit pixel PX9*b*, and the thirteenth unit pixel PX13*b* may receive the demodulation control signal having the same phase.

The unit pixels PX1*b*~PX16*b* included in the pixel array 30*b* may sense incident light of the image sensing device ISD during the detection time. During the detection time, incident light is incident upon the image sensing device ISD, and a demodulation signal is applied to the unit pixels PX1*b*~PX16*b* included in the pixel array 30*b*. During the detection time, the unit pixels PX1*b*~PX16*b* can detect photocharges corresponding to the incident light that is incident upon the image sensing device ISD when the demodulation control signal having an activation voltage is applied to the image sensing device ISD.

When the activation voltage is applied to the control region, a hole current may occur such that a detection region adjacent to the control region can capture charges. For example, the activation voltage may be set to 1.2 V.

When the deactivation voltage is applied to the control region, a hole current may not occur such that a detection region adjacent to the control region does not capture charges. For example, the deactivation voltage may be set to zero volts (0V). The demodulation control signal may control the activation voltage or the deactivation voltage to be applied to the control region according to a predetermined period.

In some implementations of the disclosed technology, the image sensing device ISD may simultaneously transmit a demodulation control signal having an activation voltage to the adjacent unit pixels (e.g., PX1b and PX3b), such that the unit pixels (e.g., PX1b and PX3b) can reduce a photocharge detection time corresponding to incident light.

The demodulation signal applied to each of the unit pixels PX1b to PX4b included in the first unit matrix MX1b will be described later with reference to FIG. 11.

The unit pixels to which the demodulation control signal having the same phase as the modulated light is applied may be repeatedly arranged at predetermined positions in the pixel array 30b. Therefore, the operation for detecting light incident upon the respective unit pixels PX1b~PX4b included in the first unit matrix MX1b can also be applied to another (2×2) matrix (e.g., a (2×2) matrix including the fifth to eighth unit pixels PX5b~PX8b and other (2×2) matrices) included in the pixel array 30b.

FIG. 8 is a schematic diagram illustrating an example of a unit pixel included in the pixel array 30b shown in FIG. 7 based on some implementations of the disclosed technology.

Referring to FIG. 8, the unit pixels (PXb) included in the pixel array 30b may be identical in structure to each other.

The unit pixel (PXb) included in the pixel array 30b may include a sensing region 300b and a transistor region 310b. The sensing region 300b may include a photoelectric conversion region 110, a control region 120, a detection region 130, a guard ring region 140, and a drain region 150. The transistor region 310b may include a drive transistor DX, a transfer transistor TX, a selection transistor SX, a reset transistor RX, a floating diffusion (FD) region (not shown), and a drain transistor DRX.

The remaining parts other than the drain region 150 and the drain transistor DRX in the unit pixel (PXb) are substantially identical in structure to the unit pixel (PXa) shown in FIG. 3, and thus the redundant descriptions will be omitted for brevity. The unit pixel (PXb) shown in FIG. 8 will hereinafter be described with regard to the drain region 150 and the drain transistor DRX.

The drain region 150 may be disposed between the guard ring region 140 and the detection region 130. The drain region 150 may be doped with N-type impurities.

The drain region 150 may remove photocharges that are not captured by the detection region 130. In some implementations, the drain region 150 may be formed to surround the detection region 130.

When the activation voltage is not applied to the control region 120, the drain region 150 may prevent photocharges from being captured in the detection region 130. In addition, the drain region 150 may remove the photocharges that are generated when the activation voltage is not applied to the control region 120 and then remain in the photoelectric conversion region 110. The photocharges removed by the drain region 150 will be referred to as surplus photocharges.

The photoelectric conversion region 110 may generate photocharges corresponding to incident light that is incident upon the unit pixel (PXb). Therefore, although the activation voltage is not applied to the control region 120, photocharges caused by the incident light can also be generated.

If photocharges are captured in the detection region 130 even when the activation voltage is not applied to the control region 120 or if photocharges are generated when the activation voltage is not applied and such generated photocharges are captured, those captured photocharges may serve as noise, such that a difference (i.e., contrast) between detection signals of the adjacent unit pixels can be reduced.

As a result, an unexpected error may occur in the process for calculating the distance to the target object 1 using the image processor (not shown).

The drain region 150 may remove surplus photocharges that might be detected in the control region 120, such that only the pixel signal corresponding to the demodulation control signal that is transferred from each unit pixel to the control region 120 can be detected.

Referring to FIG. 8, one unit pixel (PXb) may include a plurality of drain regions 150. Although each of the drain regions 150 shown in FIG. 8 is formed to have two parts extending to different directions (e.g., a clamp shape) and is formed between the control region 120 and the detection region 130, other implementations are also possible. For example, the drain regions 150 can have any other shapes capable of easily removing surplus photocharges.

In addition, although the unit pixel (PXb) shown in FIG. 8 includes four drain regions 150, the number of the drain regions 150 is not limited thereto, and the position of the drain regions 150 can also be changed to any other positions from which photocharges can be easily removed. For example, each of the drain regions 150 may have a circular shape or a polygonal shape, and may be formed to surround the control region 120 and the detection region 130. Various embodiments of the drain regions 150 will be described later with reference to FIGS. 14A to 14C.

The drain transistor DRX may be connected to the drain region 150 so that the drain transistor DRX can remove photocharges of the photoelectric conversion region 110 through the drain regions 150. The drain transistor DRX may be disposed in the transistor region 310b.

The drain transistor DRX may be activated in response to a drain transistor control signal, such that photocharges remaining in the photoelectric conversion region 110 of the unit pixel (PXb) can be removed (or reset).

The drain transistor control signal applied to the unit pixel (PXb) may have a phase difference of π(180°) with respect to the demodulation control signal applied to each unit pixel (PXb).

Since the drain transistor control signal has a phase difference of π(180°) with respect to the demodulation control signal, the drain transistor DRX may be activated by the deactivation voltage applied to the control region 120 included in each unit pixel (PXb). When the drain transistor DRX is activated, the drain regions 150 may remove photocharges (i.e., surplus photocharges) that are generated by the photoelectric conversion region 110 or remain in the photoelectric conversion region 110.

The drain transistor control signal may be received from the row driver 41 shown in FIG. 1.

FIG. 9 is a schematic diagram illustrating the connection relationship between a cross-section of the unit pixel (PXb) taken along a second cutting line B-B' shown in FIG. 8 and constituent elements included in the unit pixel (PXb) based on some implementations of the disclosed technology.

Like the sensing region(for example: sensing region (300a) in FIG. 4) described in FIG. 4, the sensing region 300b may include a photoelectric conversion region 110, a control region 120, detection regions 130, and guard ring regions 140. In addition, the sensing region 300b may include a passivation layer 200 and one or more drain regions 150.

The transistor region 300b may include a reset transistor RX, a transfer transistor TX, a first capacitor C1, a second capacitor C2, a floating diffusion transistor FDX, a drive transistor DX, and a selection transistor SX. The transistor region 300b may further include a drain transistor DRX.

The connection relationship between a cross-section of the unit pixel (PXb) shown in FIG. 9 and pixel transistors included in the unit pixel (PXb) other than the drain region 150 and the drain transistor DRX are substantially identical to the cross-section of the unit pixel (PXa) shown in FIG. 4, and as such redundant description thereof will herein be omitted for brevity. The unit pixel (PXb) shown in FIG. 9 will hereinafter be described centering upon the drain region 150 and the drain transistor DRX.

The drain region 150 may include N-type impurity regions having different doping densities. For example, the N-type impurity region (i.e., N⁻ region) having a relatively low doping density may be implanted into the substrate to a seventh depth, and the N-type impurity region (i.e., N⁺ region) having a relatively high doping density may be implanted into the substrate to an eighth depth at the same position as the above N⁻-type impurity implantation position. The seventh depth may be greater than the eighth depth. In addition, the seventh depth may be smaller than each of the third depth (i.e., the depth of the impurity region having a relatively lower doping density in the detection region 130) and the first depth (i.e., the depth of the impurity region having a relatively lower doping density in the control region 120).

When the seventh depth is greater than the first depth, the drain region 150 may interrupt movement of a hole current flowing between the control region 120 and the guard ring region 140. In addition, in a situation in which the seventh depth is greater than the third depth, when the activation voltage is applied to the control region 120, the drain region 150 can interrupt easy photocharge capture of the detection region 130. In other words, the seventh depth may be changed according to the position of the detection region 130 and the position of the hole current generated between the guard ring region 140 and the control region 120.

The unit pixel (PXb) based on other implementations of the disclosed technology may include a drain transistor DRX in the transistor region 310b. The drain transistor DRX may be activated in response to a logic high level of the drain transistor control signal DRS supplied to a gate electrode thereof, such that surplus photocharges can be removed through the drain region 150.

The drain region 150 may be connected to one end of the drain transistor DRX, and the pixel voltage ($V_{px}$) may be coupled to the other end of the drain transistor DRX. When the drain transistor DRX is activated, the pixel voltage ($V_{px}$) is applied to the drain region 150, such that the photoelectric conversion region 110 can be reset to the pixel voltage ($V_{px}$).

The drain transistor control signal DRS may have a phase difference of $\pi(180°)$ with respect to the demodulation control signal ($V_{cs}$) applied to the control region 120. Therefore, when the demodulation control signal ($V_{cs}$) has the activation voltage, the drain transistor control signal DRS may have a logic low level. When the demodulation control signal ($V_{cs}$) has the deactivation voltage, the drain transistor control signal DRS may have a logic high level.

In addition, the drain transistor DRX included in the unit pixel (PXb) may be activated together with the reset transistor RX.

After photocharges have moved to the floating diffusion (FD) region through the transfer transistor TX, the photocharges accumulated in the floating diffusion (FD) region may be output as the pixel signal after passing through the drive transistor DX and the selection transistor SX.

After the photocharges accumulated in the floating diffusion (FD) region are output as the pixel signal, the row driver 41 may output the reset signal RST having a logic high level to the reset transistor RX. By the reset signal RST having a logic high level, each of the unit pixels (PXb) may be reset to the pixel voltage ($V_{px}$).

The row driver 41 may control the reset control signal RST to have an activation signal at a time point where the drain transistor control signal DRS has the activation voltage, such that photocharges remaining in the photoelectric conversion region 110 and the unit pixel (PXb) can be easily removed.

Figure 10:
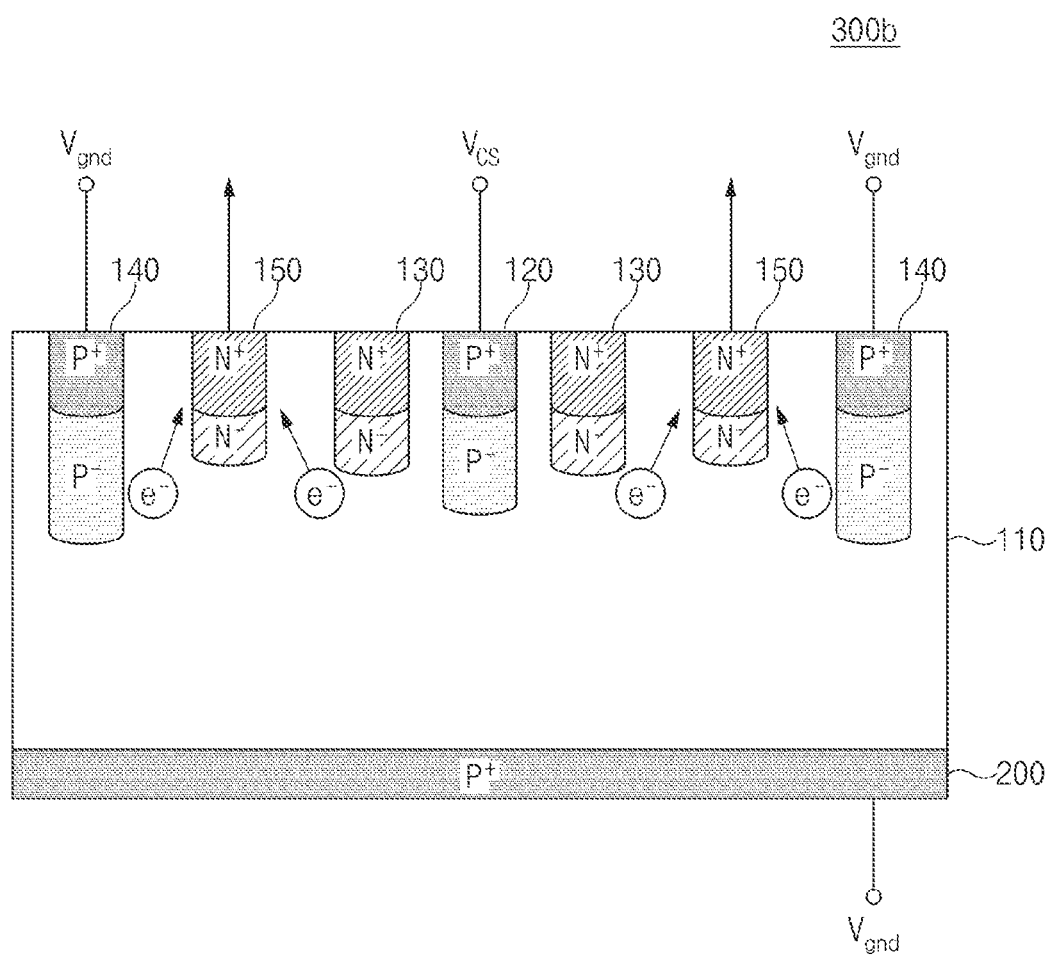
FIG. 10 is a schematic diagram illustrating a photocharge removal operation of a drain region based on some implementations of the disclosed technology.

FIG. 10 is a schematic diagram illustrating a photocharge removal operation of the drain region based on some implementations of the disclosed technology.

FIG. 10 illustrates the sensing region 300b so as to explain the photocharge removal operation of the image sensing device including the drain region 150.

When the demodulation control signal ($V_{cs}$) having the deactivation voltage (e.g., 0V) is applied to the control region 120, flow of a hole current may not occur between the control region 120 and the guard ring region 140, and flow of a hole current may not also occur between the control region 120 and the passivation layer 200.

Not only photocharges that are generated by the photoelectric conversion region 110 and are not detected when the activation voltage (e.g., 0V) is applied to the control region 120, but also photocharges that are generated when the deactivation voltage is applied to the control region 120 can be removed through the drain region 150.

In more detail, when the drain transistor control signal DRS having a logic high level is applied to the drain transistor DRX connected to the drain region 150, photocharges remaining in the photoelectric conversion region 110 can be removed through the drain region 150.

Surplus photocharges remaining in the photoelectric conversion region 110 are removed, such that noise of the signals detected from the respective unit pixels can be reduced.

Figure 11:
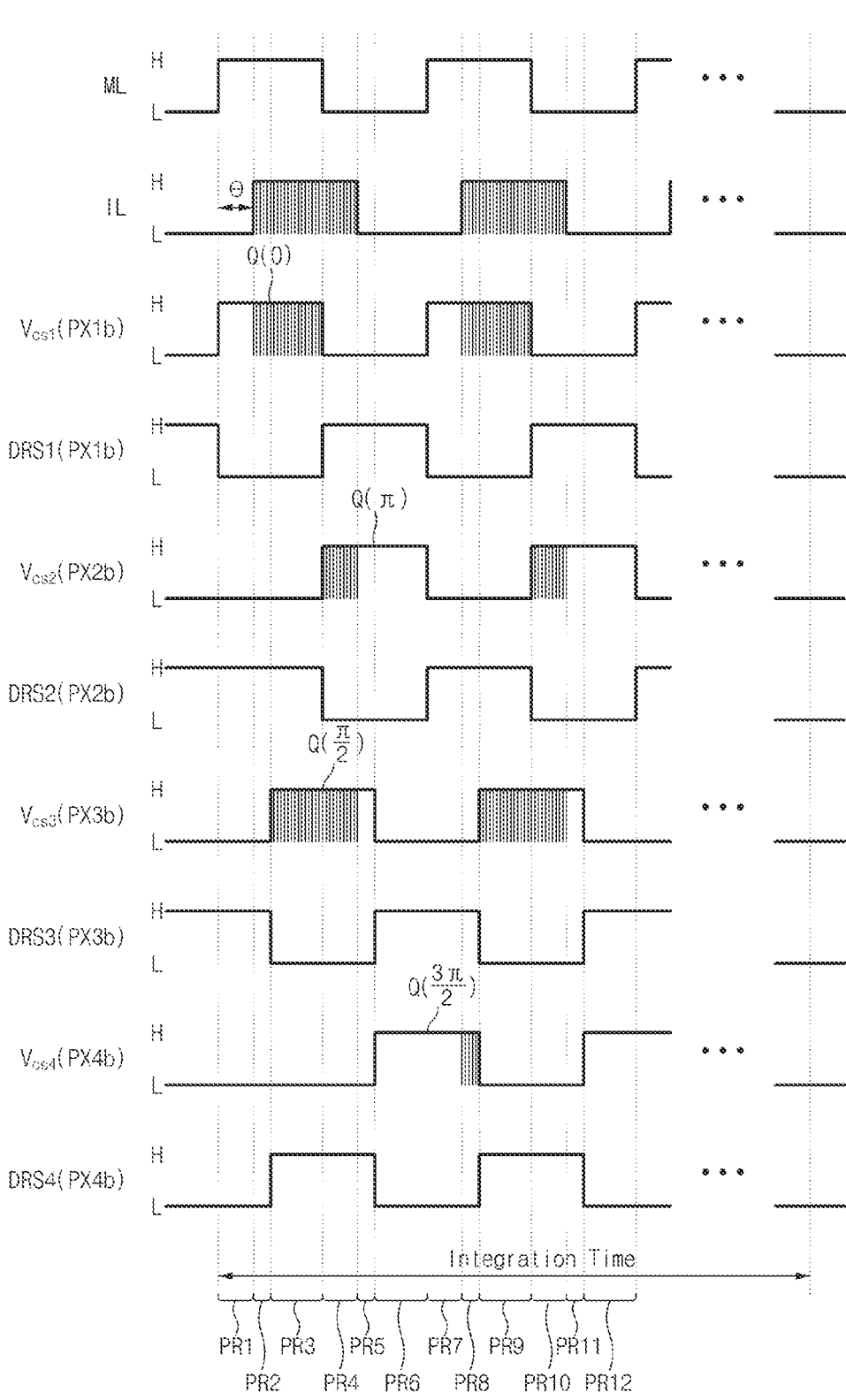
FIG. 11 is a timing diagram illustrating operations of the image sensing device based on some other implementations of the disclosed technology.

FIG. 11 is a timing diagram illustrating operations of the image sensing device based on other implementations of the disclosed technology.

FIG. 11 illustrates examples of the modulated light (ML), the incident light (IL), first to fourth demodulation control signals $V_{cs1}$~$V_{cs4}$, and first to fourth drain transistor control signals DRS1~DRS4.

The unit pixels to which the demodulation control signal having the same phase is applied may be repeatedly arranged in the pixel array 30b. The operation for detecting light incident upon the respective unit pixels PX1b~PX4b included in the first unit matrix MX1b can be substantially and equally applied to another (2×2) matrix (e.g., a (2×2) matrix including the fifth to eighth unit pixels PX5b~PX8b) included in the pixel array 30b. In FIG. 10, signals applied to the unit pixels PX1b~PX4b included in the first unit matrix MX1b shown in FIG. 7 are shown as the example.

The first to fourth demodulation control signals $V_{cs1}$~$V_{cs4}$ respectively applied to the first to fourth unit pixels PX1b~PX4b shown in FIG. 11 are substantially identical to those of FIG. 6, and as such redundant description thereof will herein be omitted for brevity. The following description will hereinafter be given centering upon the first to fourth drain transistor control signals RRS1~RRS4 respectively applied to the first to fourth unit pixels PX1b~PX4b.

The first drain transistor control signal RRS1 may be applied to the first drain transistor included in the first unit pixel PX1b. The second drain transistor control signal RRS2 may be applied to the second drain transistor included in the second unit pixel PX2b. The third drain transistor control signal RRS3 may be applied to the third drain transistor included in the third unit pixel PX3b. The fourth drain transistor control signal RRS4 may be applied to the fourth drain transistor included in the fourth unit pixel PX4b.

Like the demodulation control signals (for example, $V_{cs1}$~$V_{cs4}$ in FIG. 6) described in FIG. 6, the demodulation control signals $V_{cs1}$~$V_{cs4}$ having different phases with respect to the modulated light (ML) may be respectively applied to the first to fourth unit pixels PX1b~PX4b. The demodulation control signals $V_{cs1}$~$V_{cs4}$ may have the activation voltage at the same time point.

For example, each of the first demodulation control signal ($V_{cs1}$) applied to the first unit pixel PX1b and the third demodulation control signal ($V_{cs3}$) applied to the third unit pixel PX3b may have the activation voltage in the third period PR3.

The first drain transistor control signal DRS1 may have a phase difference of π(180°) with respect to the first demodulation control signal ($V_{cs1}$) applied to the first unit pixel PX1b.

As illustrated in FIGS. 8 and 9, the demodulation control signals $V_{cs1}$~$V_{cs4}$ respectively applied to the unit pixels PX1b~PX4b may have a phase difference of π(180° with respect to the drain transistor control signals DRS1~DRS4 respectively applied to the unit pixels PX1b~PX4b, such that the drain region 150 can remove surplus photocharges generated in the photoelectric conversion region 110 in a time period in which each of the demodulation control signals $V_{cs1}$~$V_{cs4}$ has the deactivation voltage.

For example, the first unit pixel PX1b receives the first drain transistor control signal DRS1 as an input, such that the drain region 150 can remove surplus photocharges generated in the photoelectric conversion region 110 in each of the fourth period PR4, the fifth period PRS, the sixth period PR6, the tenth period PR10, the eleventh period PR11, and the twelfth period PR12.

The second unit pixel PX2b receives the second drain transistor control signal DRS2 as an input, such that the drain region 150 can remove surplus photocharges generated in the photoelectric conversion region 110 in each of the first period PR1, the second period PR2, the third period PR3, the seventh period PR7, the eighth period PR8, and the ninth period PR9.

The third unit pixel PX3b receives the third drain transistor control signal DRS3 as an input, such that the drain region 150 can remove surplus photocharges generated in the photoelectric conversion region 110 in each of the sixth period PR6, the seventh period PR7, the eighth period PR8, and the twelfth period PR12.

The fourth unit pixel PX4b receives the fourth drain transistor control signal DRS4 as an input, such that the drain region 150 can remove surplus photocharges generated in the photoelectric conversion region 110 in each of the third period PR3, the fourth period PR4, the fifth period PRS, the ninth period PR9, the tenth period PR10, and the eleventh period PR11.

In association with the unit pixels PX1b~PX4b, surplus photocharges generated in a time period in which the deactivation voltage is applied to the control region 120 are removed, such that a difference (i.e., contrast) between signals detected by the unit pixels PX1b~PX4b may increase and detection of the distance to the target object 1 may be facilitated.

In addition, the drain transistor DRX included in each unit pixel may be activated together with the reset transistor RX.

The row driver 41 may allow the reset control signal RST to have the activation signal at a specific time where each of the drain transistor control signals DRS1~DRS4 has an activation voltage, such that the photocharges remaining in both the photoelectric conversion region 110 and the entire unit pixel can be easily removed.

Figure 12:
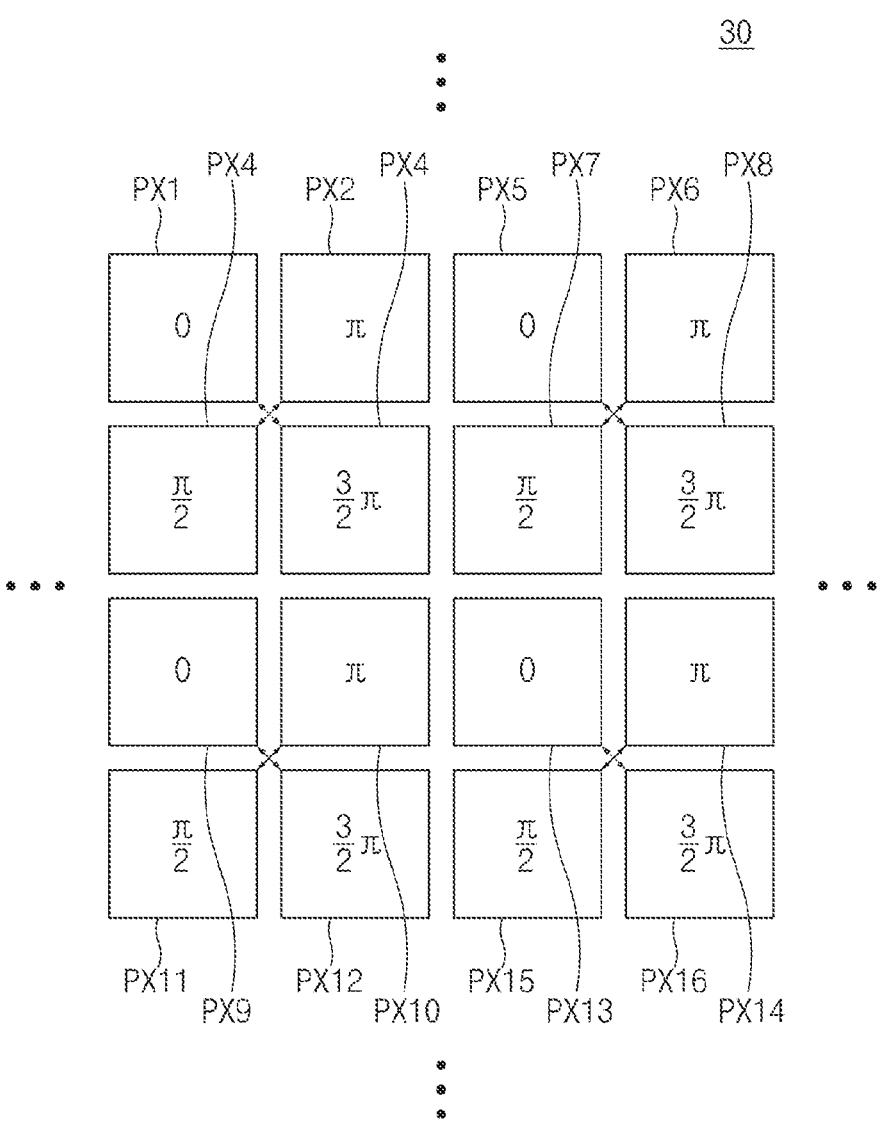
FIGS. 12 and 13 are conceptual diagrams illustrating examples of a method for measuring the distance using the image sensing device based on some other implementations of the disclosed technology.
Figure 13:
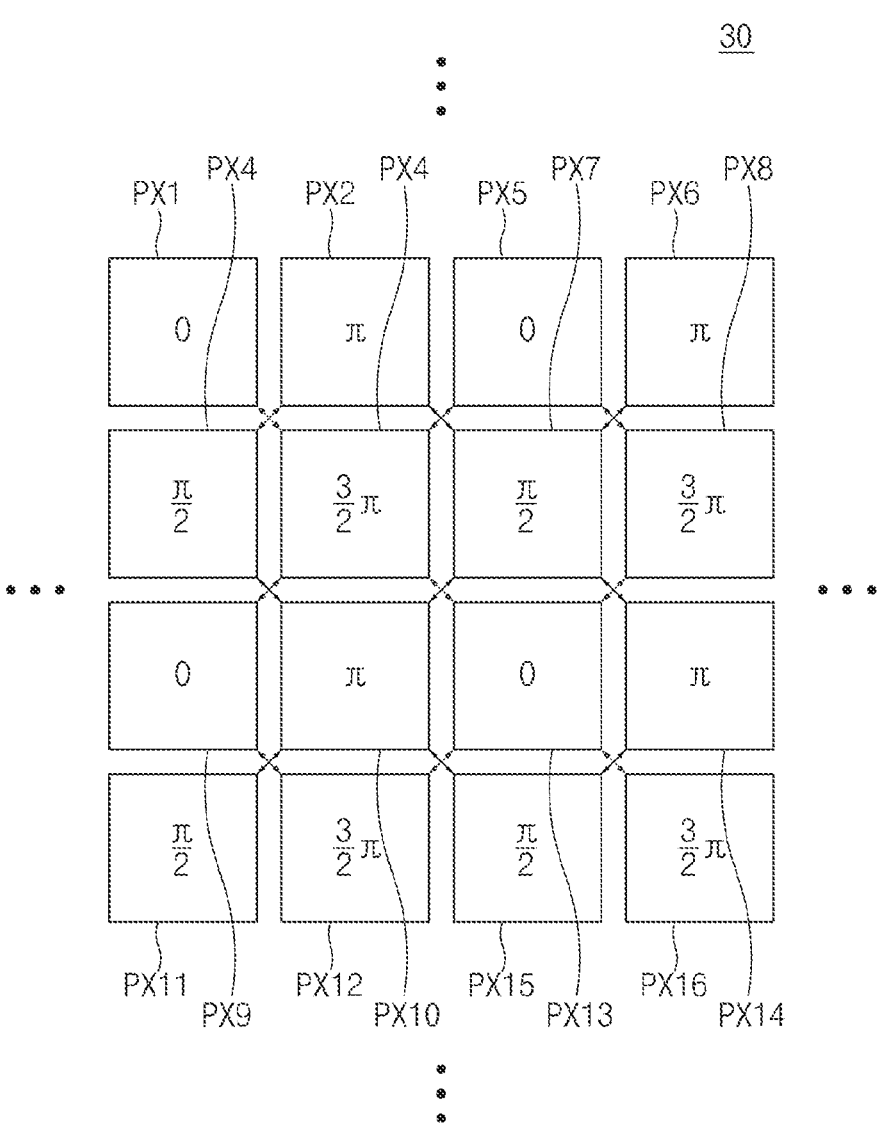

FIGS. 12 and 13 are diagrams illustrating examples of a method for measuring the distance using the image sensing device based on some other implementations of the disclosed technology.

Although the pixel array 30 shown in FIGS. 12 and 13 includes 16 unit pixels PX1~PX16 for convenience of description, the pixel array 30 may include an arbitrary number of unit pixels as needed.

The first unit pixel PX1, the fifth unit pixel PX5, the ninth unit pixel PX9, and the thirteenth unit pixel PX13 may be unit pixels to which the demodulation control signal (i.e., a first demodulation control signal $V_{cs1}$) having the same phase with respect to the modulated light (ML) is applied.

Therefore, each of the first unit pixel PX1, the fifth unit pixel PX5, the ninth unit pixel PX9, and the thirteenth unit pixel PX13 may generate the pixel signal corresponding to photocharges $Q(0)$ of the incident light (IL) received at a time point where the first demodulation control signal ($V_{cs1}$) has the activation voltage.

The second unit pixel PX2, the sixth unit pixel PX6, the tenth unit pixel PX10, and the fourteenth unit pixel PX14 may be unit pixels to which the demodulation control signal (i.e., a second demodulation control signal $V_{cs2}$) having a phase difference of π(180°) with respect to the modulated light (ML) is applied.

Therefore, each of the second unit pixel PX2, the sixth unit pixel PX6, the tenth unit pixel PX10, and the fourteenth unit pixel PX14 may generate the pixel signal corresponding to photocharges $Q(π)$ of the incident light (IL) received at a time point where the second demodulation control signal ($V_{cs2}$) has the activation voltage.

The third unit pixel PX3, the seventh unit pixel PX7, the eleventh unit pixel PX11, and the fifteenth unit pixel PX15 may be unit pixels to which the demodulation control signal (i.e., a third demodulation control signal $V_{cs3}$) having a phase difference of π/2(90°) with respect to the modulated light (ML) is applied.

Therefore, each of the third unit pixel PX3, the seventh unit pixel PX7, the eleventh unit pixel PX11, and the fifteenth unit pixel PX15 may generate the pixel signal corresponding to photocharges $Q(π/2)$ of the incident light (IL) received at a time point where the third demodulation control signal ($V_{cs3}$) has the activation voltage.

The fourth unit pixel PX4, the eighth unit pixel PX8, the twelfth unit pixel PX12, and the sixteenth unit pixel PX16 may be unit pixels to which the demodulation control signal (i.e., a fourth demodulation control signal $V_{cs4}$) having a phase difference of 3π/2(270°) with respect to the modulated light (ML) is applied.

Therefore, each of the fourth unit pixel PX4, the eighth unit pixel PX8, the twelfth unit pixel PX12, and the sixteenth unit pixel PX16 may generate the pixel signal corresponding to photocharges $Q(3π/2)$ of the incident light (IL) received when the fourth demodulation control signal ($V_{cs4}$) has the activation voltage.

As illustrated in FIG. 12, the image processor (not shown) may use pixel signals generated from the first to fourth unit pixels PX1~PX4, or may use pixel signals generated from the fifth to eighth unit pixels PX5~PX8, such that the image processor can obtain information about the distance from the image sensing device ISD to the target object 1. According to the distance measurement method shown in FIG. 12, one information about the distance can be obtained by the pixel signals from the four unit pixels.

In addition, the image processor (not shown) may obtain information about the distance from the image sensing device ISD to the target object 1 using the pixel signals generated from four adjacent unit pixels shown in FIG. 13. For example, the distance measurement method shown in FIG. 13 may use pixel signals generated from the first to fourth unit pixels PX1~PX4, or may use pixel signals generated from the second unit pixel PX2, the fifth unit pixel PXS, the fourth unit pixel PX4, and the seventh unit pixel PX7, such that the image processor can obtain information about the distance from the image sensing device ISD to the target object 1. According to the distance measurement method shown in FIG. 13, one information about the distance can be obtain by one unit pixel.

Figure 14A:
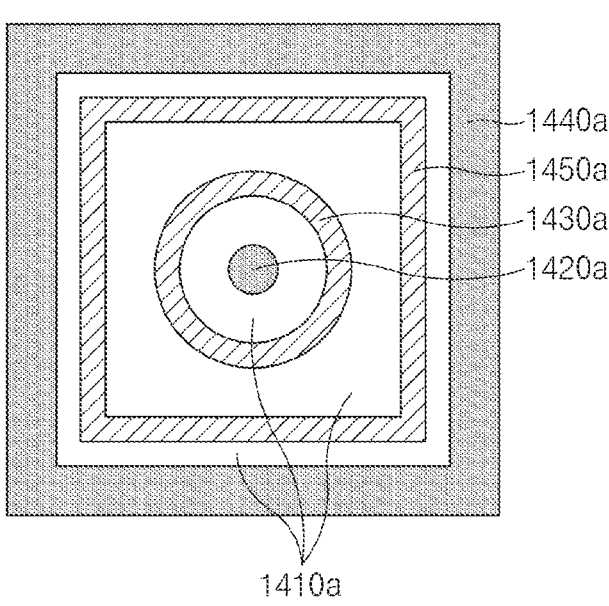
FIGS. 14A to 14C are schematic diagrams illustrating other examples of a drain region included in the unit pixel base on some other implementations of the disclosed technology.
Figure 14B:
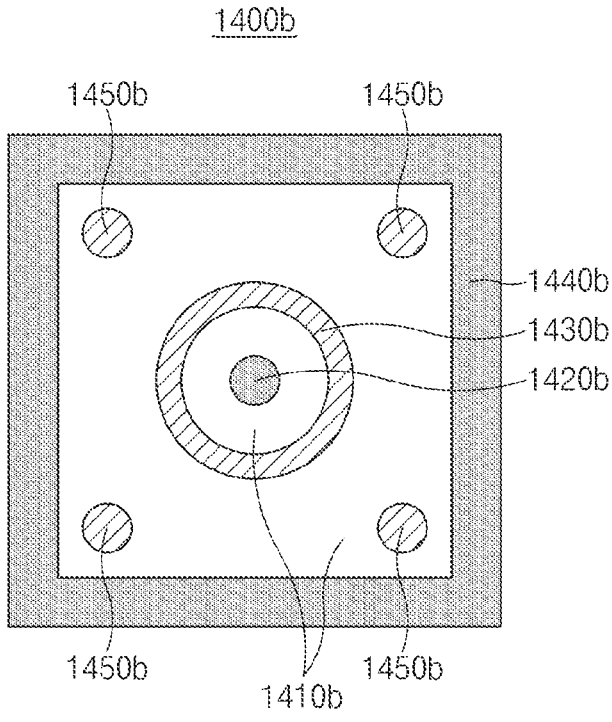
Figure 14C:
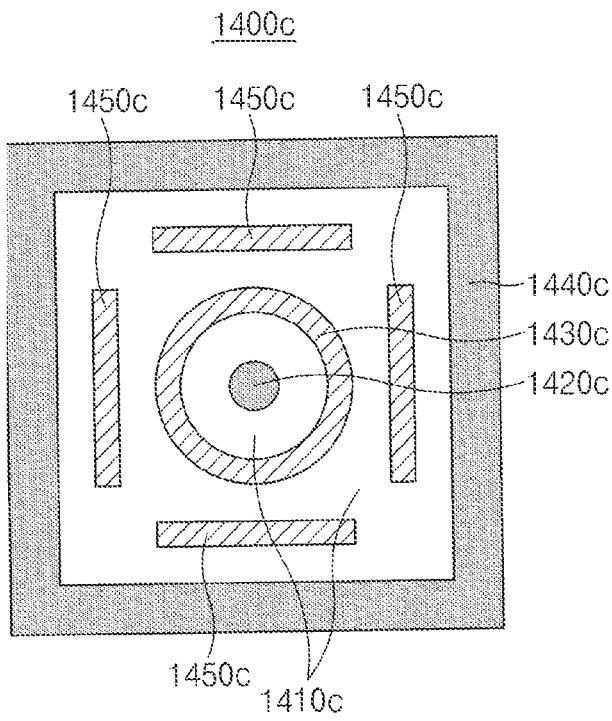

FIGS. 14A to 14C are schematic diagrams illustrating other examples of a drain region included in the unit pixel based on some implementations of the disclosed technology.

Referring to FIG. 14A, a drain region 1450a included in a unit pixel 1400a may be formed in a ring shape that completely surrounds the detection region 1430a. The drain region 1450a is formed in a ring shape and the drain transistor control signal having an activation level is applied to the drain transistor DRX, such that surplus photocharges can be easily removed from the entire photoelectric conversion region 1410a through the drain region 1450a.

Referring to FIG. 14B, a drain region 1450b included in a unit pixel 1400b may be formed in a circular shape, and may be formed to be located at each vertex of a guard ring region 1440b. As the drain region 1450b is located at a vertex of the guard ring region 1440b, the drain region 1450b is formed in the vicinity of the vertex of each guard ring region 1440b, such that photocharges that have not moved along the hole current can be easily removed.

Referring to FIG. 14C, a drain region 1450c included in a unit pixel 1400c may be formed along the edge of a guard ring region 1440c, and may be formed in a square or rectangular shape. Since the drain region 1450c is formed along the edge of the guard ring region 1440c, the drain region 1450c can easily remove the photocharges that are formed in the vicinity of the edge of each guard ring region 1440c and do not move along the hole current.

When the drain regions 1450a, 1450b, and 1450c are formed to occupy an excessively larger region than the photoelectric conversion regions 1410a, 1410b, and 1410c, photoelectric conversion efficiency for incident light may be reduced, such that performance of the image sensing device ISD can be reduced. In contrast, when each of the drain regions 1450a, 1450b, and 1450c is formed to occupy a smaller region, it may be difficult to easily remove surplus photocharges. Accordingly, the shape of the drain region may be determined experimentally in consideration of the above-mentioned elements, and shapes of the drain region are merely examples, and the technical idea of the disclosed technology is not limited thereto.

As is apparent from the above description, the image sensing device based on some implementations of the disclosed technology can allow a control region included in a unit pixel to be surrounded by a guard ring region, such that electron detection efficiency can be improved and signal interference between adjacent unit pixels can be reduced.

In the image sensing device based on other implementations of the disclosed technology, each unit pixel includes a drain region, such that noise electrons generated by each unit pixel can be removed.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that modifications and/or enhancements to the disclosed embodiments and other embodiments can be devised based on what is described and/or illustrated in this patent document.

What is claimed is:

1. An image sensing device, comprising:
a plurality of unit pixels,
wherein each of the plurality of unit pixels includes:
a photoelectric conversion region disposed in a substrate, and generating photocharges in response to incident light;
a control region disposed in the substrate and operating to receive a control signal that periodically transits from an activation voltage to a deactivation voltage and generate a current in the substrate based on the control signal to carry and move the photocharges generated in the photoelectric conversion region;
a detection region disposed in the substrate and operating to receive the current and capture the photocharges carried by the current; and
a guard ring region surrounding the control region and configured to receive a ground voltage,
wherein
a hole current flows between the control region and the guard ring region, and
the detection region is disposed between the control region and the guard ring region.

2. The image sensing device according to claim 1, wherein:
the plurality of unit pixels is arranged in multiple rows and columns of a pixel array; and
the guard ring region operates to control a movement of the photocharges generated between two adjacent unit pixels.

3. The image sensing device according to claim 1, wherein:
the control region operates to receive the control signal having
a first voltage or a second voltage.

4. The image sensing device according to claim 3, wherein:
the control signal has a phase difference of a certain degree with respect to the incident light.

5. The image sensing device according to claim 1, wherein the plurality of unit pixels includes four unit pixels constructing a (2×2) matrix array; and
control regions of the four unit pixels receive control signals having different phases from one another.

6. The image sensing device of claim 5, wherein the control signals having different phases include a first control signal having a phase difference of 90° with respect to a second control signal; the second control signal having a phase difference of 90° with respect to a third control signal; the third control signal having a phase difference of 90° with respect to a fourth control signal; and the fourth control signal having a phase difference of 90° with respect to the first control signal.

7. The image sensing device according to claim 1, wherein:

the detection region is disposed to surround the control region; and the guard ring region is disposed to surround the control region.

8. The image sensing device according to claim 1, wherein:

the guard ring region operates to receive a voltage.

9. The image sensing device according to claim 1, wherein the guard ring region includes:

a first region doped with P-type conductive impurities; and a second region doped with P-type conductive impurities.

10. The image sensing device according to claim 9, wherein:

the first region has a higher doping density than that of the second region, and a doping depth of the first region in the substrate is smaller than a doping depth of the second region in the substrate.

11. An image sensing device, comprising:

a plurality of unit pixels, wherein each of the plurality of unit pixels receiving an incident light and generating photocharges corresponding to the incident light and includes:

at least one tap region including a control region configured to receive a control signal that periodically transits from an activation voltage to a deactivation voltage and generate a current based on the control signal, and a detection region surrounding the control region and configured to capture the photocharges moving by the current; and a guard ring region disposed to surround the at least one tap region and controlling a movement of the photocharges between tap regions included in two adjacent unit pixels, wherein the guard ring region is configured to receive a ground voltage, and wherein the control region and the guard ring region disposed in a substrate.

12. The image sensing device according to claim 11, wherein the plurality of unit pixels includes four unit pixels constructing a (2×2) matrix array; and the at least one tap region of the four unit pixels receive control signals having different phases from one another.

13. The image sensing device according to claim 12, wherein:

the control signals having different phases include a first control signal having a phase difference of 90° with respect to a second control signal;

the second control signal having a phase difference of 90° with respect to a third control signal;

the third control signal having a phase difference of 90° with respect to a fourth control signal; and the fourth control signal having a phase difference of 90° with respect to the first control signal.

14. The image sensing device according to claim 13, wherein the control regions of the four unit pixels receive the first to fourth control signals, respectively.

15. The image sensing device according to claim 11, wherein the plurality of unit pixels includes four unit pixels constructing a (2×2) matrix array and output pixel signals that are used to calculate to obtain depth data about a target object.

16. The image sensing device according to claim 12, wherein: pixel signals respectively detected from the four unit pixels included in the (2×2) matrix array are calculated to obtain depth data about a target object.

* * * * *